(12) United States Patent
Nakazawa

(10) Patent No.: US 12,489,103 B2
(45) Date of Patent: Dec. 2, 2025

(54) SEMICONDUCTOR MODULE

(71) Applicant: FUJI ELECTRIC CO., LTD., Kawasaki (JP)

(72) Inventor: Masayoshi Nakazawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 457 days.

(21) Appl. No.: 18/057,223

(22) Filed: Nov. 20, 2022

(65) Prior Publication Data

US 2023/0084150 A1 Mar. 16, 2023

Related U.S. Application Data

(63) Continuation of application No. PCT/JP2021/043612, filed on Nov. 29, 2021.

(30) Foreign Application Priority Data

Dec. 17, 2020 (JP) ................. 2020-209604

(51) Int. Cl.
*H01L 25/18* (2023.01)
*H01L 23/00* (2006.01)
(Continued)

(52) U.S. Cl.
CPC ............ *H01L 25/18* (2013.01); *H01L 23/053* (2013.01); *H01L 23/15* (2013.01);
(Continued)

(58) Field of Classification Search
CPC ... H01L 2224/48225; H01L 2924/1203; H01L 2924/1206; H01L 2924/13055
See application file for complete search history.

(56) References Cited

U.S. PATENT DOCUMENTS

2009/0251119 A1* 10/2009 Stojcic .............. H01L 23/49513
257/691
2016/0209284 A1* 7/2016 Takayama ............. H01L 23/053
(Continued)

FOREIGN PATENT DOCUMENTS

JP 2000082773 A 3/2000
JP 2000323647 A 11/2000
(Continued)

OTHER PUBLICATIONS

International Search Report and (ISA/237) Written Opinion of the International Search Authority for International Patent Application No. PCT/JP2021/043612, mailed by the Japan Patent Office on Jan. 18, 2022.

*Primary Examiner* — Walter H Swanson

(57) ABSTRACT

A semiconductor module including: a plurality of first semiconductor chips; a resin case provided surrounding an accommodation space for accommodating the plurality of first semiconductor chips; a first gate terminal connected to a gate pad of the plurality of first semiconductor chips; a plurality of first main gate wirings provided in the accommodation space, each of which is connected to the gate pad of the plurality of first semiconductor chips; and a first adjusting gate wiring arranged between at least one of the plurality of first main gate wirings and the first gate terminal, and configured to adjust a difference in wiring lengths between the plurality of first semiconductor chips and the first gate terminal is provided.

26 Claims, 22 Drawing Sheets

(51) Int. Cl.
*H01L 23/053* (2006.01)
*H01L 23/15* (2006.01)
*H01L 23/538* (2006.01)

(52) U.S. Cl.
CPC .......... *H01L 23/5386* (2013.01); *H01L 24/48* (2013.01); *H01L 2224/48225* (2013.01); *H01L 2924/1203* (2013.01); *H01L 2924/1206* (2013.01); *H01L 2924/13055* (2013.01)

(56) References Cited

U.S. PATENT DOCUMENTS

| | | |
|---|---|---|
| 2017/0179018 A1 | 6/2017 | Inaba |
| 2018/0241319 A1 | 8/2018 | Bando |
| 2020/0395344 A1 | 12/2020 | Horie |

FOREIGN PATENT DOCUMENTS

| | | |
|---|---|---|
| JP | 2002141463 A | 5/2002 |
| JP | 2003060157 A | 2/2003 |
| JP | 2013229383 A | 11/2013 |
| JP | 2017112210 A | 6/2017 |
| JP | 2018133520 A | 8/2018 |
| WO | 2020054806 A1 | 3/2020 |

\* cited by examiner

SEMICONDUCTOR MODULE

The contents of the following Japanese patent application(s) are incorporated herein by reference:
NO. 2020-209604 filed in JP on Dec. 17, 2020
NO. PCT/JP2021/043612 filed in WO on Nov. 29, 2021

BACKGROUND

1. Technical Field

The present invention relates to a semiconductor module.

2. Related Art

Conventionally, a semiconductor module mounted with a semiconductor chip such as an IGBT (Insulated Gate Bipolar Transistor), or a SiCMOSFET has been known. In such a semiconductor module, the semiconductor chip and a gate terminal are connected through a wiring (refer to Patent Documents 1 to 5, for example).

PRIOR ART DOCUMENT

Patent Document

Patent Document 1: Japanese Patent Application Publication No. 2000-82773
Patent Document 2: Japanese Patent Application Publication No. 2000-323647
Patent Document 3: Japanese Patent Application Publication No. 2002-141463
Patent Document 4: Japanese Patent Application Publication No. 2003-60157
Patent Document 5: Japanese Patent Application Publication No. 2013-229383

DESCRIPTION OF EXEMPLARY EMBODIMENTS

Figure 1:
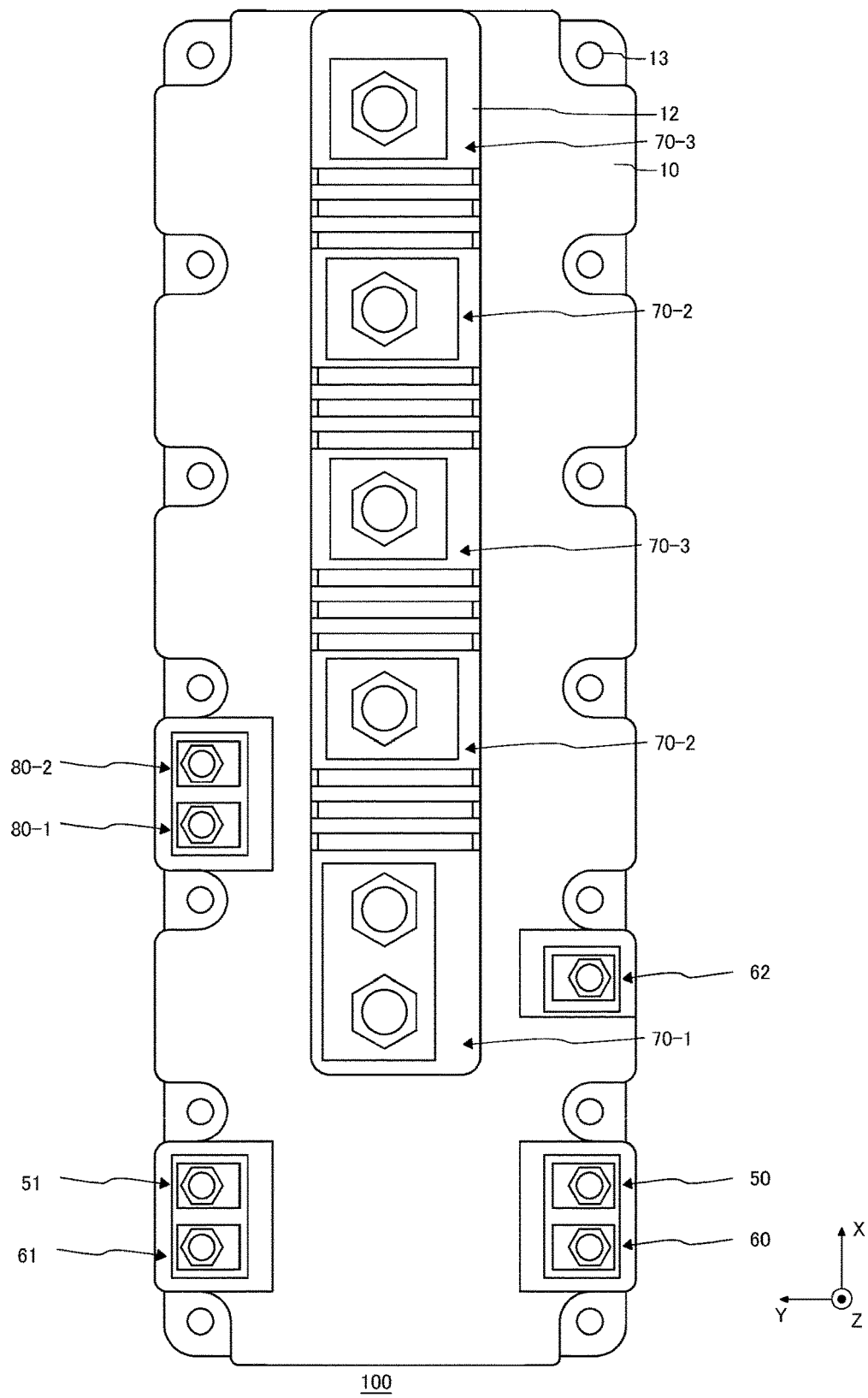
FIG. 1 illustrates one example of a semiconductor module 100 according to one embodiment of the present invention.

Hereinafter, the invention will be described through embodiments of the invention, but the following embodiments do not limit the present invention according to claims. In addition, not all of the combinations of features described in the embodiments are essential to the solving means of the invention. Note that, in the present specification and the drawings, elements having substantially the same functions and configurations are denoted by the same reference numerals, and redundant descriptions for them are omitted. Also, elements not directly related to the present invention are omitted from the drawings. Further, in one drawing, elements having the same functions and configurations are denoted by a representative reference numeral, and other reference numerals for the elements may be omitted.

As used herein, one side in a direction parallel to a depth direction of a semiconductor chip is referred to by a phrase "upper" and the other side is referred to by a phrase "lower". One of two main surfaces of a substrate, a layer or other member is referred to by a phrase "upper surface", and the other surface is referred to by a phrase "lower surface". The "upper" and "lower" directions are not limited to a gravity direction or a direction at a time of mounting a semiconductor module.

As used herein, technical matters may be described with orthogonal coordinate axes consisting of an X axis, a Y axis, and a Z axis. The orthogonal coordinate axes are merely for specifying relative positions of components, and so not for limiting to a specific direction. For example, the Z axis is not limited to indicate a height direction with respect to the ground. Also, a +Z axis direction and a −Z axis direction are directions opposite to each other. When a direction is referred to as the Z axis direction without these "+" and "−" signs, it means being parallel to the +Z and −Z axes. As used herein, orthogonal axes parallel to the upper surface and the lower surface of the semiconductor chip are referred to by an X axis and a Y axis. Moreover, an axis perpendicular to the upper surface and the lower surface of the semiconductor chip is referred to by the Z axis. As used herein, a direction of the Z axis may be referred to as a depth direction. Further, as used herein, a direction including an X axis direction and a Y axis direction, and being parallel to the upper surface and the lower surface of the semiconductor chip may be referred to as a horizontal direction.

As used herein, phrases such as "same" or "equal" may be used even when there is an error caused from a variation in manufacturing step or the like. This error is within a range of 10% or less, for example.

FIG. 1 illustrates one example of a semiconductor module 100 according to one embodiment of the present invention. The semiconductor module 100 may function as a power conversion device such as an inverter or a converter. The semiconductor module 100 accommodates an electronic circuit such as a semiconductor chip or the like inside. The semiconductor module 100 of the present example includes a resin case 10 and a lid 12.

The resin case 10 accommodates an electronic circuit such as a semiconductor chip or the like inside. In the present example, the resin case 10 is provided surrounding an accommodation space 194 (see FIG. 6) for accommodating a plurality of semiconductor chips. By way of example, the resin case 10 is connected to a base plate 15 (see FIG. 2) having a substrate on which an electronic circuit is arranged. The lid 12 is fixed to the base plate 15 with adhesion or the like, and covers at least a part of the base plate 15. An electronic circuit is arranged on the base plate 15 covered by the lid 12. A corner of the resin case 10 has a through hole 13 such as a screw hole for fixing the semiconductor module 100 to an outside.

A plurality of main terminals 70 are provided on the lid 12. In the present example, a main terminal 70-1, a main terminal 70-2, and a main terminal 70-3 are provided on the lid 12. The plurality of main terminals 70 is electrically connected to the electronic circuit covered by the lid 12. The main terminal 70 is formed of conductive material. For example, each main terminal 70 forms a current path for a large current that flows in a power device such as an IGBT. At least a part of a main surface of the main terminal 70 is exposed to a front surface of the lid 12. The main terminal 70 of the present example has a plate shape.

The resin case 10 is provided with a gate terminal, a sense-emitter terminal, and a temperature sense terminal 80. In the present example, the resin case 10 is provided with a first gate terminal 50, a second gate terminal 51, a first sense-emitter terminal 60, a second sense-emitter terminal 61, a third sense-emitter terminal 62, a temperature sense terminal 80-1, and a temperature sense terminal 80-2. The gate terminal, sense-emitter terminal, and temperature sense terminal 80 may have areas smaller than that of the main terminal 70 in a top view. The gate terminal, sense-emitter terminal, and temperature sense terminal 80 are electrically connected to the electronic circuit arranged on the base plate 15. In response to applying a gate voltage to the gate terminal, the gate voltage is applied to a gate pad of each semiconductor chip. Therefore, the each semiconductor chip can be controlled by controlling the gate voltage. A sense-current can be measured by the sense-emitter terminal. A temperature of the semiconductor module 100 can be measured by the temperature sense terminal 80.

In the present example, the resin case 10 and the lid 12 are molded with resin such as thermosetting resin with which they can be formed through injection molding, or ultraviolet curing resin with which they can be formed through UV molding. The resin may contain one or more polymer materials selected from a polyphenylene sulfide (PPS) resin, a polybutylene terephthalate (PBT) resin, a polyamide (PA) resin, an acrylonitrile butadiene styrene (ABS) resin, an acrylic resin and the like.

Figure 2:
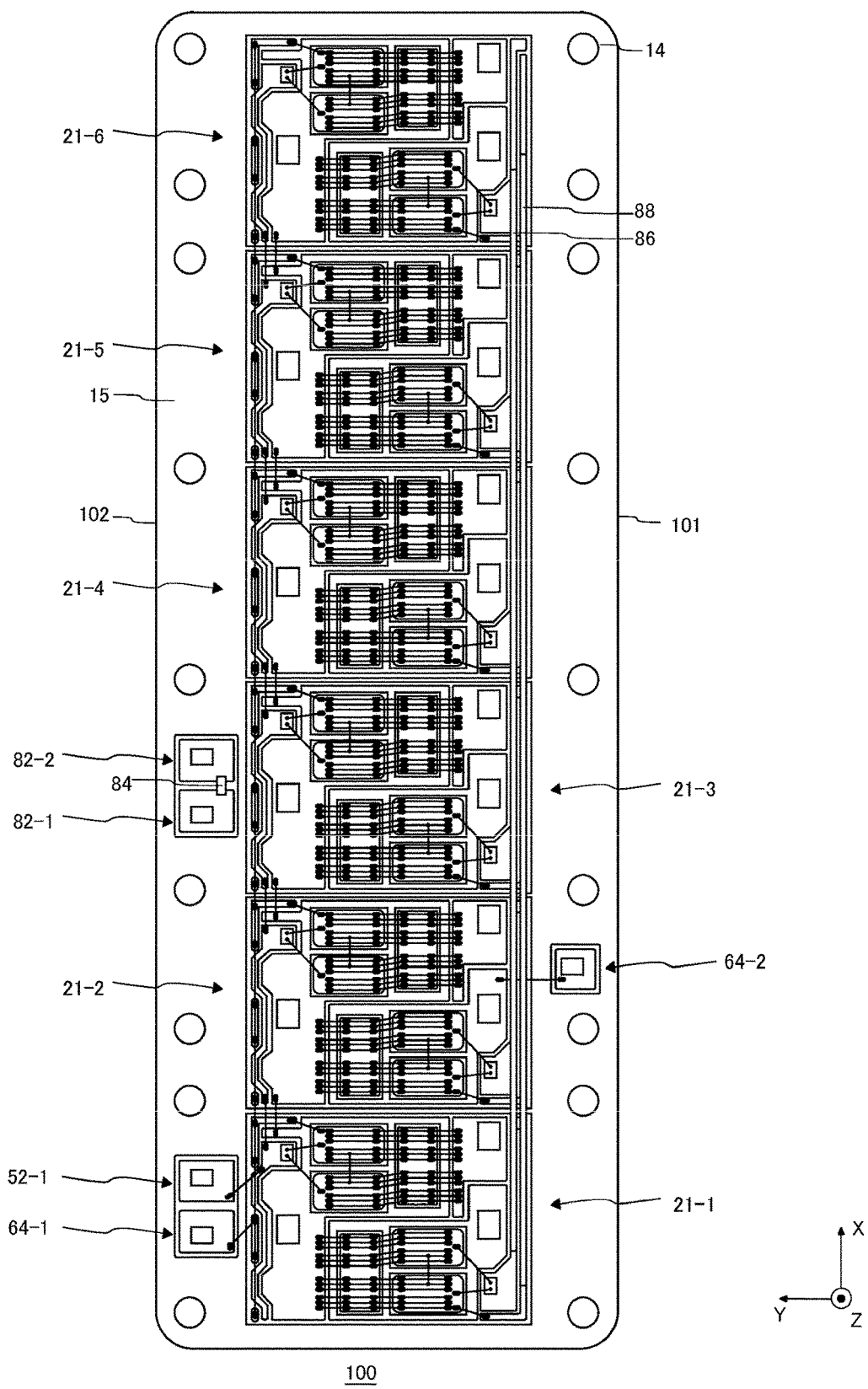
FIG. 2 illustrates one example of an inside of the semiconductor module 100 in a top view.

FIG. 2 illustrates one example of an inside of the semiconductor module 100 in a top view. In FIG. 2, the resin case 10 and the lid 12 are omitted from the illustration. In FIG. 2, the semiconductor module 100 includes the base plate 15, a plurality of insulating substrates 21, a first adjusting gate wiring 86, and a first adjusting sense wiring 88.

One or more insulating substrates 21 are arranged on the base plate 15. In the present example, an insulating substrate 21-1, an insulating substrate 21-2, an insulating substrate 21-3, an insulating substrate 21-4, an insulating substrate 21-5, and an insulating substrate 21-6 are arranged on the base plate 15 along the X axis direction. A plurality of semiconductor chips and a circuit pattern are arranged on an insulating substrate 21. Although a plurality of insulating substrates 21 are arranged on the base plate 15 in the present example, one insulating substrate 21 can be arranged on the base plate 15. The insulating substrate 21 is arranged on the base plate 15 with a metal board 16 (see FIG. 4) placed in-between. The base plate 15 has a first edge 101 and a second edge 102 being opposite to each other. A corner of the base plate 15 is provided with a through hole 14 such as a screw hole for fixing the semiconductor module 100 to an outside. A position of at least one through hole 14 may match a position of the through hole 13 of the resin case 10 in a top view.

A gate connecting portion 52, a sense-emitter connecting portion 64, and a temperature sense connecting portion 82 are provided on the base plate 15. The gate connecting portion 52, sense-emitter connecting portion 64, and temperature sense connecting portion 82 are connected to each terminal. The gate connecting portion 52, sense-emitter connecting portion 64, and temperature sense connecting portion 82 may be a circuit pattern provided on the base plate 15. In the present example, a gate connecting portion 52-1 is connected to the second gate terminal 51. The sense-emitter connecting portion 64-1 is connected to the second sense-emitter terminal 61. A sense-emitter connecting portion 64-2 is connected to the third sense-emitter terminal 62. A temperature sense connecting portion 82-1 is connected to the temperature sense terminal 80-1. A temperature sense connecting portion 82-2 is connected to the temperature sense terminal 80-2.

The temperature sense connecting portion 82-1 and temperature sense connecting portion 82-2 are connected to a temperature sensor 84. The temperature sensor 84 is a thermistor, by way of example.

The first adjusting gate wiring 86 and first adjusting sense wiring 88 are arranged on the base plate 15. The first adjusting gate wiring 86 is connected to the first gate terminal 50. The first adjusting sense wiring 88 is connected to the first sense-emitter terminal 60.

Figure 3:
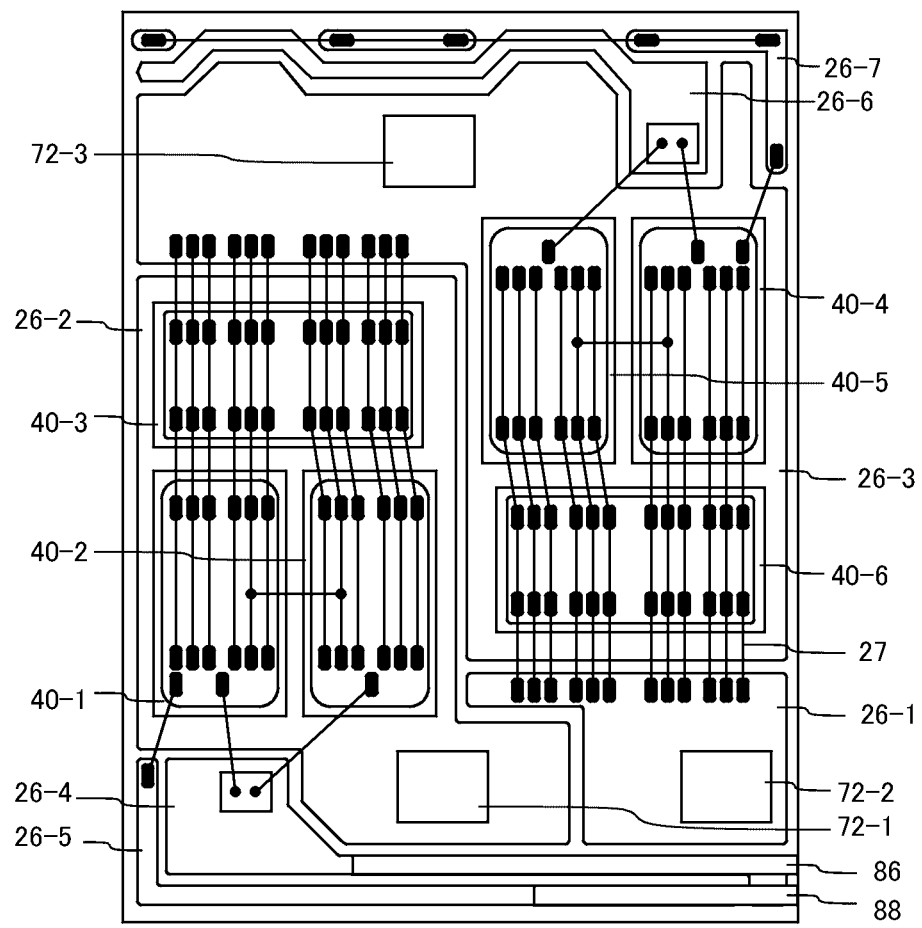
FIG. 3 illustrates one example of an insulating substrate 21-1 in a top view.

FIG. 3 illustrates one example of the insulating substrate 21-1 in a top view. The insulating substrate 21-1 includes a semiconductor chip 40, a circuit pattern 26, and a wire 27. The semiconductor chip 40, circuit pattern 26, and wire 27 are provided in the accommodation space 194. In FIG. 3, arrangement for the first adjusting gate wiring 86 and the first adjusting sense wiring 88 on the insulating substrate 21-1 is also illustrated.

At least one semiconductor chip 40 is arranged on the insulating substrate 21-1. In the present example, a semiconductor chip 40-1, a semiconductor chip 40-2, a semiconductor chip 40-3, a semiconductor chip 40-4, a semiconductor chip 40-5, and a semiconductor chip 40-6 are arranged. In the present example, the semiconductor chips 40-1, 40-2, and 40-3 are arranged on an upper surface of a circuit pattern 26-2 on the insulating substrate 21. The semiconductor chips 40-4, 40-5, and 40-6 are arranged on an upper surface of a circuit pattern 26-3 on the insulating substrate 21.

In the present example, the semiconductor chips 40-1, 40-2, 40-4, and 40-5 are IGBTs, and the semiconductor chips 40-3 and 40-6 are FWDs (Free Wheel Diodes). An RC (Reverse Conducting)-IGBT being a combination of an IGBT, a FWD, and the like may be arranged on the insulating substrate 21 instead of an IGBT and a FWD. A main electrode and the gate pad are provided on front surfaces of the semiconductor chips 40-1, 40-2, 40-4, and 40-5. The main electrode is an emitter electrode, by way of example. A back-surface electrode is provided on back surfaces of the semiconductor chips 40-1, 40-2, 40-4, and 40-5. The back-surface electrode is a collector electrode, by way of example. An anode electrode is provided on front surfaces of the semiconductor chips 40-3 and 40-6. A cathode electrode is provided on back surfaces of the semiconductor chips 40-3 and 40-6. The semiconductor chips 40-1, 40-2, and 40-3 are one example of the first semiconductor chip. The first semiconductor chip may configure a lower arm of the semiconductor module 100. The semiconductor chips 40-4, 40-5, and 40-6 are one example of the second semiconductor chip. The second semiconductor chip may configure an upper arm of the semiconductor module 100.

As illustrated in FIG. 2, one or more insulating substrates 21 are arranged on the base plate 15. At least one semiconductor chip 40 is arranged on each of the one or more insulating substrates 21. That is, the semiconductor module 100 includes a plurality of semiconductor chips 40. In the present example, the at least one semiconductor chip 40 is arranged on each of the plurality of insulating substrates 21.

The circuit pattern 26 is arranged on an upper surface of the insulating substrate 21. The circuit pattern 26 is a wiring pattern provided on the insulating substrate 21. In the present example, a circuit pattern 26-1, a circuit pattern 26-2, a circuit pattern 26-3, a circuit pattern 26-4, a circuit pattern 26-5, a circuit pattern 26-6 and a circuit pattern 26-7 are arranged on the upper surface of the insulating substrate 21. The circuit pattern 26 may be configured by directly bonding a copper plate or an aluminum plate, or a plated plate of these materials, or bonding the same through a brazing layer to the insulating substrate 21 consisting of aluminum oxide ceramics, silicon nitride ceramics, aluminum nitride ceramics, or the like. The insulating substrate 21 may be consisting of ceramics added with zirconium oxide, yttrium oxide, or the like. The circuit pattern 26 may be consisting of an alloy containing at least any one of copper or aluminum. The insulating substrate 21 and the circuit pattern 26 may be formed by sticking an insulation sheet on a conductive member such as a copper plate or an aluminum plate. In other words, the insulating substrate 21 and the circuit pattern 26 may be a plate member made of conductive member and an insulating member formed integrally.

A main connecting portion 72-2 is arranged on the circuit pattern 26-1. The main connecting portion 72-2 is connected to the main terminal 70-3. The circuit pattern 26-1 is connected to front surfaces of the semiconductor chips 40-4, 40-5, and 40-6 arranged on the circuit pattern 26-3 through the wire 27. That is, the front surfaces of the semiconductor chips 40-4, 40-5, and 40-6 are connected to the main terminal 70-3 through the circuit pattern 26-1.

A main connecting portion 72-3 is arranged on the circuit pattern 26-3. The main connecting portion 72-3 is connected to the main terminal 70-1. Therefore, the back surfaces of the semiconductor chips 40-4, 40-5, and 40-6 are connected to the main terminal 70-1 through the circuit pattern 26-3.

A main connecting portion 72-1 is arranged on the circuit pattern 26-2. The main connecting portion 72-1 is connected to the main terminal 70-2. Therefore, the back surfaces of the semiconductor chips 40-1, 40-2, and 40-3 are connected to the main terminal 70-2 through the circuit pattern 26-2. The front surfaces of the semiconductor chips 40-1, 40-2, and 40-3 are connected to the back surfaces of the semiconductor chips 40-4, 40-5, and 40-6 through the wire 27 and the circuit pattern 26-3.

The circuit pattern 26-4 is connected to gate pads (unillustrated) of the semiconductor chips 40-1 and 40-2 through the wire 27. The gate pads of the semiconductor chips 40-1 and 40-2 are connected to the first gate terminal 50 through the first adjusting gate wiring 86. The circuit pattern 26-4 is one example of the first main gate wiring.

The circuit pattern 26-5 is connected to a main electrode of the semiconductor chip 40-1 through the wire 27. The main electrode of the semiconductor chip 40-1 is connected to the first sense-emitter terminal 60 through the first adjusting sense wiring 88. The circuit pattern 26-5 is one example of the first main sense wiring.

The circuit pattern 26-6 is connected to gate pads (unillustrated) of the semiconductor chips 40-4 and 40-5 through the wire 27. The gate pads of the semiconductor chips 40-4 and 40-5 are connected to the second gate terminal 51 through the gate connecting portion 52-1. The circuit pattern 26-6 is one example of the second main gate wiring.

The circuit pattern 26-7 is connected to a main electrode of the semiconductor chip 40-4 through the wire 27. The main electrode of the semiconductor chip 40-4 is connected to the second sense-emitter terminal 61 through the sense-emitter connecting portion 64-1. The circuit pattern 26-7 is one example of the second main sense wiring.

Another insulating substrate 21 may have the same configuration as that of the insulating substrate 21-1. In other words, the semiconductor module 100 may include the plurality of semiconductor chips 40, a plurality of circuit patterns 26, and a plurality of wires 27. Each of the plurality of circuit patterns 26-4 is connected to each gate pad of the plurality of first semiconductor chips 40. Each of the plurality of circuit patterns 26-5 is connected to each main electrode of the plurality of first semiconductor chips 40. Each of the plurality of circuit patterns 26-6 is connected to each gate pad of a plurality of second semiconductor chips 40. Each of the plurality of circuit patterns 26-7 is connected to each main electrode of a plurality of third semiconductor chips 40.

The sense-emitter connecting portion 64-2 may be connected to the circuit pattern 26-2. In the example of FIG. 2, the sense-emitter connecting portion 64-2 is connected to the circuit pattern 26-2 on the insulating substrate 21-2.

In FIG. 2, a gate voltage is applied to the gate pad at a time of operating each semiconductor chip 40. That is, the gate voltage is applied to each of the first gate terminal 50 and the second gate terminal 51. By virtue of applying the gate voltage to each of the first gate terminal 50 and the second gate terminal 51, each semiconductor chip 40 arranged on the insulating substrates 21-1, 21-2, 21-3, 21-4, 21-5, and 21-6 is simultaneously switched on. At this time, if there is a difference in wiring lengths between the gate terminals and the semiconductor chips 40 arranged on each insulating substrate 21, a switching speed varies among them. A large current is then conducted to a semiconductor chip 40 having a short wiring length with the gate terminal. As a result of current concentrating at a particular semiconductor chip 40, the semiconductor chip 40 breaks down. This causes an increase in switching loss as well.

In the present example, the semiconductor module 100 includes the first adjusting gate wiring 86. The first adjusting gate wiring 86 adjusts a difference in wiring lengths between the plurality of first semiconductor chips 40 and the first gate terminal 50. In the present example, the first adjusting gate wiring 86 adjusts a difference in wiring lengths between the gate pad of each of the semiconductor chips 40-1 and 40-2, which are arranged on the insulating substrates 21-1, 21-2, 21-3, 21-4, 21-5, and 21-6, and the first gate terminal 50. By virtue of having the first adjusting gate wiring 86, current to concentrate at a particular semiconductor chip 40 can be prevented, and thus a breakdown of the semiconductor chip 40 can be prevented. This can prevent an increase in switching loss as well. The first adjusting gate wiring 86 is a conductor consisting of copper, aluminum, copper alloy, aluminum alloy, and the like. The first adjusting gate wiring 86 is a lead frame in the present example. For example, the first adjusting gate wiring 86 is in a tabular shape, and has a main surface on a surface perpendicular to a main surface (i.e., an X-Y plane) of the insulating substrate 21 and parallel to an arrangement direction (i.e., the X axis direction) of the plurality of insulating substrates 21-1 to 21-6 (i.e., an X-Z plane). The first adjusting gate wiring 86 is not limited to the lead frame, but may also be a wiring provided on a flexible substrate or the like. For example, the flexible substrate is in a tabular shape, and has a main surface on a surface perpendicular to the main surface (i.e., X-Y plane) of the insulating substrate 21 and parallel to an arrangement direction (i.e., X axis direction) of the plurality of insulating substrates 21-1 to 21-6 (i.e., X-Z plane). This manner of forming the first adjusting gate wiring 86 with the lead frame and the flexible substrate and arranging the same enables the semiconductor module 100 to be miniaturized.

In addition, the semiconductor module 100 includes the first adjusting sense wiring 88 in the present example. The first adjusting sense wiring 88 adjusts a difference in wiring lengths between the plurality of first semiconductor chips 40 and the first sense-emitter terminal 60. In the present example, the first adjusting sense wiring 88 adjusts a difference in wiring lengths between each semiconductor chip 40-1 arranged on the insulating substrates 21-1, 21-2, 21-3, 21-4, 21-5, and 21-6, and the first sense-emitter terminal 60. By virtue of having the first adjusting sense wiring 88, sense-current can be measured more precisely. The first adjusting sense wiring 88 is a conductor consisting of copper, aluminum, copper alloy, aluminum alloy, and the like. The first adjusting sense wiring 88 is a lead frame in the present example. For example, the first adjusting sense wiring 88 is in a tabular shape, and has a main surface on a surface perpendicular to a main surface (i.e., X-Y plane) of the insulating substrate 21 and parallel to an arrangement direction (i.e., X axis direction) of the plurality of insulating substrates 21-1 to 21-6 (i.e., X-Z plane). The first adjusting sense wiring 88 is not limited to the lead frame, but may also be a wiring provided on a flexible substrate or the like. For example, the flexible substrate is in a tabular shape, and has a main surface on a surface perpendicular to the main surface (i.e., X-Y plane) of the insulating substrate 21 and parallel to an arrangement direction (i.e., X axis direction) of the plurality of insulating substrates 21-1 to 21-6 (i.e., X-Z plane). This manner of forming the first adjusting sense wiring 88 with the lead frame and the flexible substrate and arranging the same enables the semiconductor module 100 to be miniaturized.

An extending direction of the first adjusting gate wiring 86 in a top view may be parallel to an extending direction of the first adjusting sense wiring 88 in the top view. In the present example, both of the extending directions of the first adjusting gate wiring 86 and the first adjusting sense wiring 88 are in the X axis direction. By virtue of making the extending directions of the first adjusting gate wiring 86 and the first adjusting sense wiring 88 parallel, the semiconductor module 100 can be miniaturized.

Figure 4:
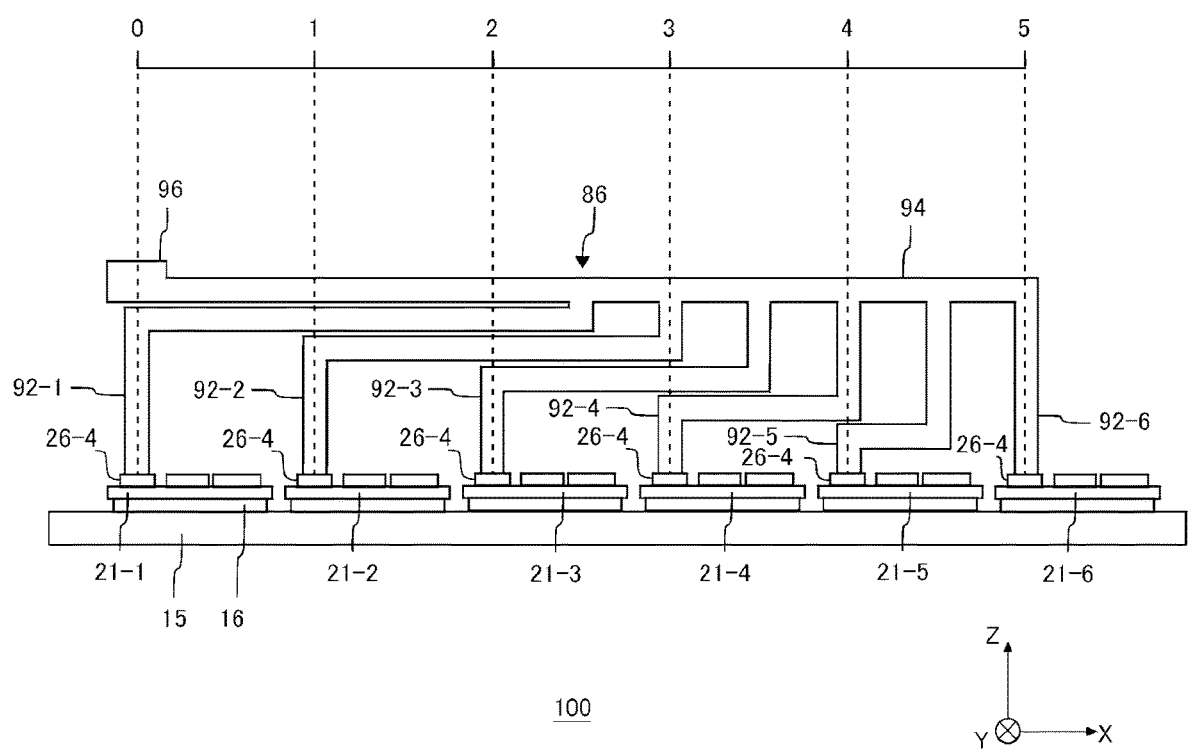
FIG. 4 illustrates one example of a first adjusting gate wiring 86 of the semiconductor module 100.

FIG. 4 illustrates one example of the first adjusting gate wiring 86 of the semiconductor module 100. FIG. 4 schematically illustrates the semiconductor module 100. In FIG. 4, the circuit pattern 26-4 being the first main gate wiring and arranged on the insulating substrate 21-1 is used as a reference.

The first adjusting gate wiring 86 is arranged between at least one of the plurality of first main gate wirings and the first gate terminal 50. In the present example, the first adjusting gate wiring 86 is arranged between the circuit pattern 26 arranged on each insulating substrate 21 and the first gate terminal 50. That is, the first gate terminal 50 is connected to the gate pads of the plurality of semiconductor chips 40 through the first adjusting gate wiring 86. Also, the first gate terminal 50 is connected to the gate pads of the plurality of semiconductor chips 40 through the plurality of first main gate wirings. In the present example, the first gate terminal 50 is connected to the gate pad of the semiconductor chip 40 provided to each insulating substrate 21 through the first main gate wiring provided to the each insulating substrate 21.

The first adjusting gate wiring 86 includes a plurality of individual gate adjusting wirings 92, a common gate adjusting wiring 94, and a gate terminal connecting portion 96. In the present example, the first adjusting gate wiring 86 includes an individual gate adjusting wiring 92-1, an individual gate adjusting wiring 92-2, an individual gate adjusting wiring 92-3, an individual gate adjusting wiring 92-4, an individual gate adjusting wiring 92-5, and an individual gate adjusting wiring 92-6. An individual gate adjusting wiring 92 is provided to each of the plurality of first semiconductor chips 40. The individual gate adjusting wiring 92 is connected to the circuit pattern 26-4 arranged on each insulating substrate 21. The common gate adjusting wiring 94 connects each individual gate adjusting wiring 92 and the first gate terminal 50. The common gate adjusting wiring 94 may be arranged above (i.e., in a +Z axis direction of) the individual gate adjusting wiring 92. Also, the common gate adjusting wiring 94 extends in an arranging direction (i.e., the X axis direction) of the plurality of insulating substrates 21, and is arranged above and along the plurality of insulating substrates 21. The first adjusting gate wiring 86 is connected to the first gate terminal 50 at the gate terminal connecting portion 96.

In the present example, the closer a distance to the first gate terminal 50 is, the longer a wiring of the individual gate adjusting wiring 92 connected to the first semiconductor chip 40. In FIG. 4, the individual gate adjusting wiring 92 has a longer wiring when it is connected to the semiconductor chip 40 arranged on the insulating substrate 21 having a smaller distance to the gate terminal connecting portion 96 in the X axis direction. In the present example, the wiring gets longer for, in an order of the individual gate adjusting wiring 92-6, the individual gate adjusting wiring 92-5, the individual gate adjusting wiring 92-4, the individual gate adjusting wiring 92-3, the individual gate adjusting wiring 92-2, and the individual gate adjusting wiring 92-1. The longer the wiring is, the larger inductance of the wiring can be. With such a configuration, the difference in wiring lengths between each semiconductor chip 40 and the first gate terminal 50 can be adjusted.

In FIG. 4, the individual gate adjusting wiring 92-1 connected to the insulating substrate 21-1 having the smallest distance to the gate terminal connecting portion 96 in the X axis direction is connected to the common gate adjusting wiring 94 at about a middle of a connection position of a closest insulating substrate 21-1 and the individual gate adjusting wiring 92-1 (i.e., position 0 of FIG. 4), and a connection position of a furthest insulating substrate 21-6 and the individual gate adjusting wiring 92-6 (position 5 of FIG. 4), that is, between positions 2 and 3 of FIG. 4. In other words, the wiring connected to the closest insulating substrate 21-1 extends in the common gate adjusting wiring 94 from a position of the closest insulating substrate 21-1 (i.e., position 0) to about half a distance between the closest insulating substrate 21-1 and the furthest insulating substrate 21-6 (i.e., between positions 2 and 3), and returns to the position of the closest insulating substrate 21-1 (i.e., position 0). The individual gate adjusting wiring 92-6 connected to the insulating substrate 21-6 having a furthest distance to the gate terminal connecting portion 96 in the X axis direction is connected to the common gate adjusting wiring 94 above the connection position (position 5 of FIG. 4). The individual gate adjusting wirings 92-2 to 92-5 connected to the insulating substrates 21-2 to 21-5 between the insulating substrates 21-1 and 21-6 are connected to the common gate adjusting wiring 94 between the individual gate adjusting wirings 92-1 and 92-6 at equal intervals. That is, the wirings connected to the insulating substrates 21-2 to 21-5 between the insulating substrates 21-1 and 21-6 extend in the common gate adjusting wiring 94 from a position of the closest insulating substrate 21-1 (i.e., position 0) to a position further than about half the distance between the closest insulating substrate 21-1 and the furthest insulating substrate 21-6 (i.e., between positions 2 and 3) and to a position closer than the furthest insulating substrate 21-6 (i.e., position 5), and return to positions for each of the insulating substrates 21-2 to 21-5 (i.e., positions 1 to 4).

Figure 5:
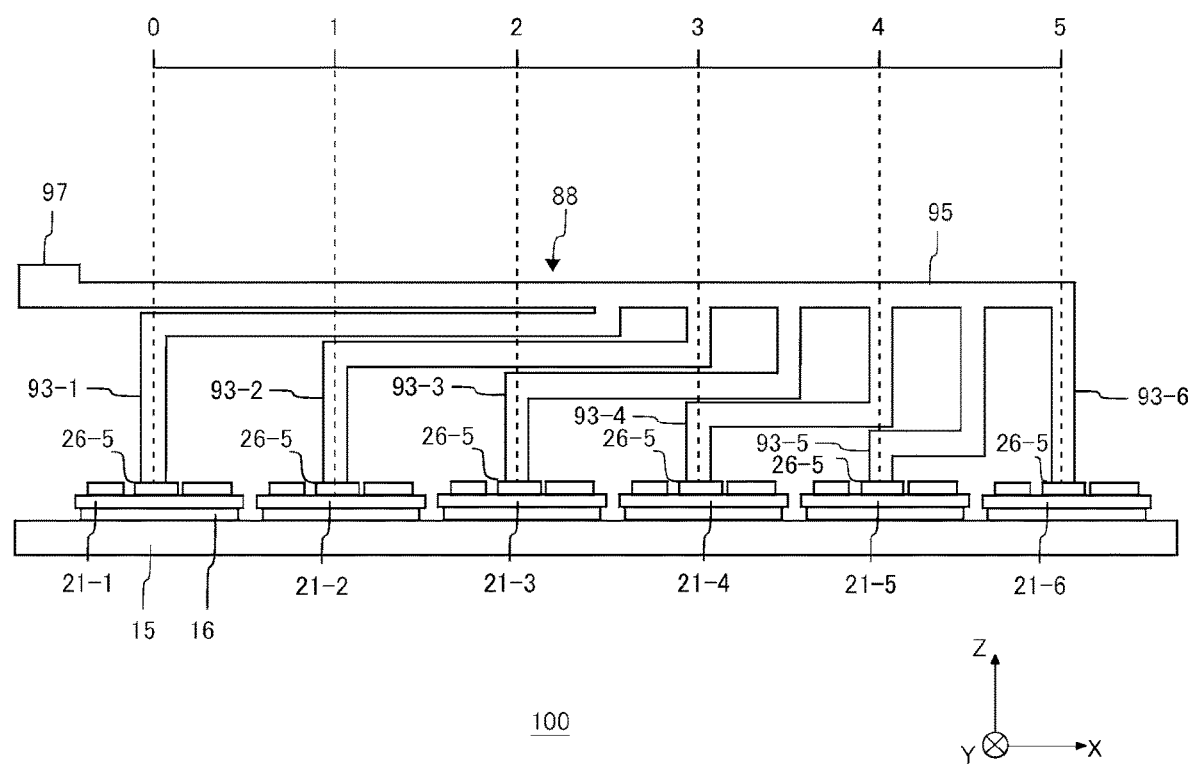
FIG. 5 illustrates one example of a first adjusting sense wiring 88 of the semiconductor module 100.

FIG. 5 illustrates one example of the first adjusting sense wiring 88 of the semiconductor module 100. FIG. 5 schematically illustrates the semiconductor module 100. In FIG. 5, the circuit pattern 26-5 being the first main sense wiring and arranged on the insulating substrate 21-1 is used as a reference.

The first adjusting sense wiring 88 is arranged between at least one of the plurality of first main sense wirings and the first sense-emitter terminal 60. In the present example, the first adjusting sense wiring 88 is arranged between the circuit pattern 26 arranged on each insulating substrate 21 and the first sense-emitter terminal 60. That is, the first sense-emitter terminal 60 is connected to the main electrodes of the plurality of semiconductor chips 40 through the first adjusting sense wiring 88. Also, the first sense-emitter terminal 60 is connected to the main electrodes of the plurality of semiconductor chips 40 through the plurality of first main sense wirings. In the present example, the first sense-emitter terminal 60 is connected to the main electrode of the semiconductor chip 40 provided to each insulating substrate 21 through the first main sense wiring provided to the each insulating substrate 21.

The first adjusting sense wiring 88 includes a plurality of individual sense adjusting wirings 93, a common-sense adjusting wiring 95, and a sense-emitter terminal connecting portion 97. In the present example, the first adjusting sense wiring 88 includes an individual sense adjusting wiring 93-1, an individual sense adjusting wiring 93-2, an individual sense adjusting wiring 93-3, an individual sense adjusting wiring 93-4, an individual sense adjusting wiring 93-5, and individual sense adjusting wiring 93-6. An individual sense adjusting wiring 93 is provided to each of the plurality of first semiconductor chips 40. The individual sense adjusting wiring 93 is connected to the circuit pattern 26-5 arranged on each insulating substrate 21. The common-sense adjusting wiring 95 connects each individual sense adjusting wiring 93 and the first sense-emitter terminal 60. The first adjusting sense wiring 88 is connected to the first sense-emitter terminal 60 at the sense-emitter terminal connecting portion 97.

In the present example, the closer a distance to the first sense-emitter terminal 60 is, the longer a wiring of the individual sense adjusting wirings 93 connected to the first semiconductor chip 40. In FIG. 5, the individual sense adjusting wiring 93 has a longer wiring when it is connected to the semiconductor chip 40 arranged on the insulating substrate 21 having a smaller distance to the sense-emitter terminal connecting portion 97 in the X axis direction. In the present example, the wiring gets longer for, in an order of the individual sense adjusting wiring 93-6, the individual sense adjusting wiring 93-5, the individual sense adjusting wiring 93-4, the individual sense adjusting wiring 93-3, the individual sense adjusting wiring 93-2, and the individual sense adjusting wiring 93-1. The longer the wiring is, the larger inductance of the wiring can be. With such a configuration, the difference in wiring lengths between each semiconductor chip 40 and the first sense-emitter terminal 60 can be adjusted.

In FIG. 5, the individual sense adjusting wiring 93-1 connected to the insulating substrate 21-1 having the smallest distance to the sense-emitter terminal connecting portion 97 in the X axis direction is connected to the common-sense adjusting wiring 95 at about a middle of a connection position of a closest insulating substrate 21-1 and the individual sense adjusting wiring 93-1 (i.e., position 0 of FIG. 5), and a connection position of a furthest insulating substrate 21-6 and the individual sense adjusting wiring 93-6 (position 5 of FIG. 5), that is, between positions 2 and 3 of FIG. 5. In other words, the wiring connected to the closest insulating substrate 21-1 extends in the common-sense adjusting wiring 95 from a position of the closest insulating substrate 21-1 (i.e., position 0) to about half a distance between the closest insulating substrate 21-1 and the furthest insulating substrate 21-6 (i.e., between positions 2 and 3), and returns to the position of the closest insulating substrate 21-1 (i.e., position 0). The individual sense adjusting wiring 93-6 connected to the insulating substrate 21-6 having a furthest distance to the sense-emitter terminal connecting portion 97 in the X axis direction is connected to the common-sense adjusting wiring 95 above the connection position (position 5 of FIG. 5). The individual sense adjusting wirings 93-2 to 93-5 connected to the insulating substrates 21-2 to 21-5 between the insulating substrates 21-1 and 21-6 are connected to the common-sense adjusting wiring 95 between the individual sense adjusting wirings 93-1 and 93-6 at equal intervals. That is, the wirings connected to the insulating substrates 21-2 to 21-5 between the insulating substrates 21-1 and 21-6 extend in the common-sense adjusting wiring 95 from a position of the closest insulating substrate 21-1 (i.e., position 0) to a position further than about half the distance between the closest insulating substrate 21-1 and the furthest insulating substrate 21-6 (i.e., between positions 2 and 3) and to a position closer than the furthest insulating substrate 21-6 (i.e., position 5), and return to positions for each of the insulating substrates 21-2 to 21-5 (i.e., positions 1 to 4).

Figure 6:
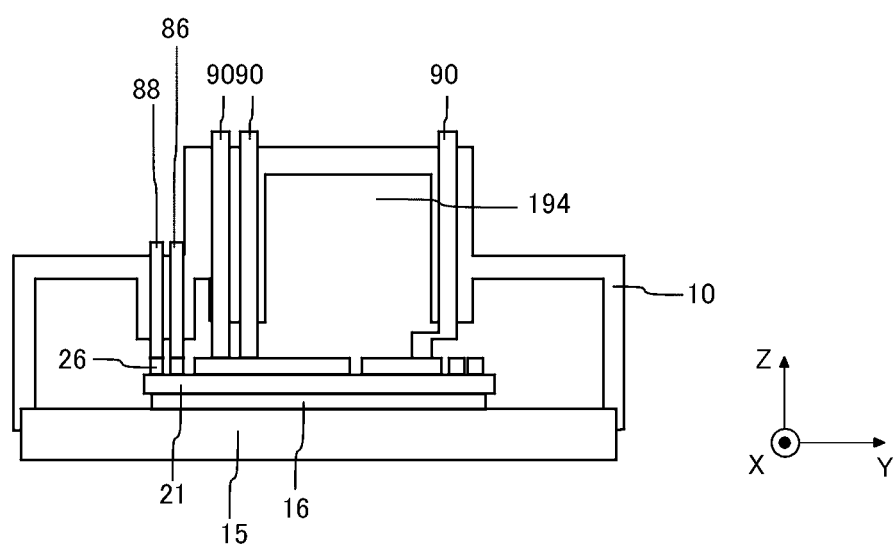
FIG. 6 schematically illustrates inside the semiconductor module 100 in a side view.

FIG. 6 schematically illustrates inside the semiconductor module 100 in a side view. In FIG. 6, the semiconductor module 100 includes the resin case 10, the base plate 15, the metal board 16, the insulating substrate 21, the circuit pattern 26, the first adjusting gate wiring 86, the first adjusting sense wiring 88, and a plurality of main terminal connecting wirings 90. A main terminal connecting wiring 90 connect the main terminal 70 and the main connecting portion 72. Note that, each terminal such as the main terminal 70 is omitted from the illustration in the present example.

In the present example, at least a part of the first adjusting gate wiring 86 is embedded in in the resin case 10. Fifty percent or more of an entire first adjusting gate wiring 86 may be embedded in the resin case 10. Eighty percent or more of the entire first adjusting gate wiring 86 may be embedded in the resin case 10. By virtue of embedding the at least a part of the first adjusting gate wiring 86 in the resin case 10, the semiconductor module 100 can be miniaturized.

In the present example, at least a part of the first adjusting sense wiring 88 is embedded in the resin case 10. Fifty percent or more of an entire first adjusting sense wiring 88 may be embedded in the resin case 10. Eighty percent or more of the entire first adjusting sense wiring 88 may be embedded in the resin case 10. By virtue of embedding the at least a part of the first adjusting sense wiring 88 in the resin case 10, the semiconductor module 100 can be miniaturized.

In the present example, the first adjusting gate wiring 86 and the first adjusting sense wiring 88 may be arranged close to each other at a prescribed interval, with their main surfaces facing one another. For example, the common gate adjusting wiring 94 and the common-sense adjusting wiring 95 are arranged at a same height from the insulating substrate 21 (in the Z axis direction), with their main surfaces facing one another. The individual gate adjusting wiring 92-1 and the individual sense adjusting wiring 93-1 have portions extending in the X axis direction, which are arranged at a same height (in the Z axis direction) with their main surfaces facing one another. Similarly, each pairs of the individual gate adjusting wiring 92-2 and the individual sense adjusting wiring 93-2, the individual gate adjusting wiring 92-3 and the individual sense adjusting wiring 93-3, the individual gate adjusting wiring 92-4 and the individual sense adjusting wiring 93-4, the individual gate adjusting wiring 92-5 and the individual sense adjusting wiring 93-5, and the individual gate adjusting wiring 92-6 and the individual sense adjusting wiring 93-6 has portions extending in the X axis direction, which are arranged at a same height (in the Z axis direction) with their main surfaces facing one another. In this manner, overall wiring inductance can be reduced further.

Figure 7:
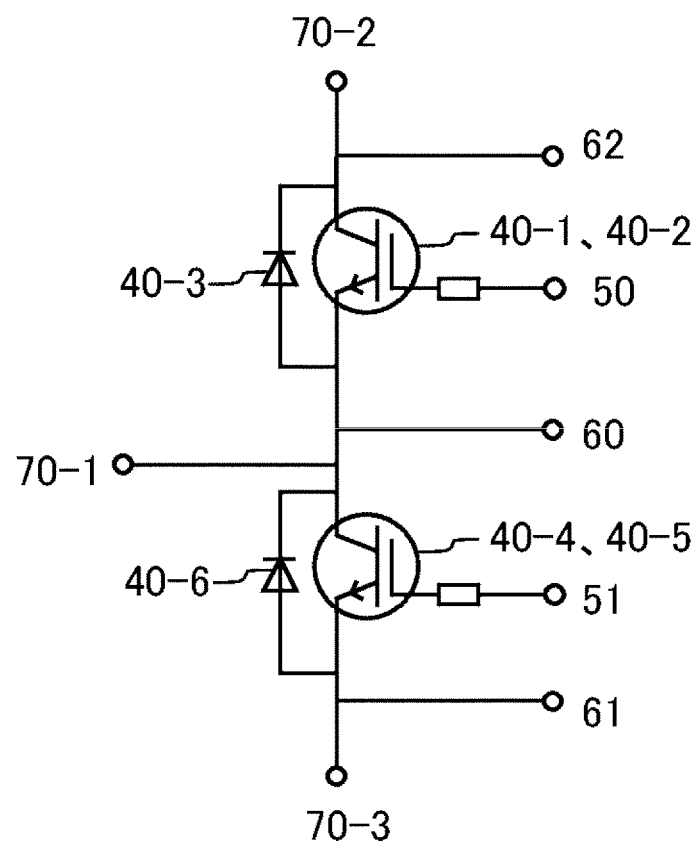
FIG. 7 illustrates one example of circuitry of a semiconductor chip 40 of the semiconductor module 100.

FIG. 7 illustrates one example of circuitry of the semiconductor chip 40 of the semiconductor module 100. The semiconductor chips 40-1, 40-2, and 40-3 are connected to the main terminal 70-2. The semiconductor chips 40-4, 40-5, and 40-6 are connected to the main terminal 70-3. The gate pads of the semiconductor chips 40-1 and 40-2 are connected to the first gate terminal 50. The gate pads of the semiconductor chips 40-4 and 40-5 are connected to the second gate terminal 51. Although there is illustrated only one semiconductor chip 40-1, 40-2, 40-3, 40-4, 40-5, and 40-6 in the present example, a semiconductor chip 40 for each insulating substrate 21 may be connected in parallel.

Figure 8:
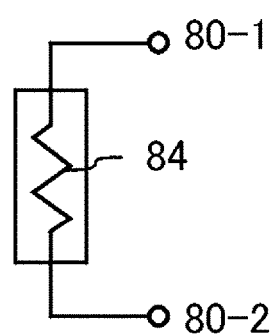
FIG. 8 illustrates one example of circuitry of a temperature sensor 84 of the semiconductor module 100.

FIG. 8 illustrates one example of circuitry of the temperature sensor 84 of the semiconductor module 100. The temperature sensor 84 is connected to the temperature sense terminal 80-1 and the temperature sense terminal 80-2.

Figure 9:
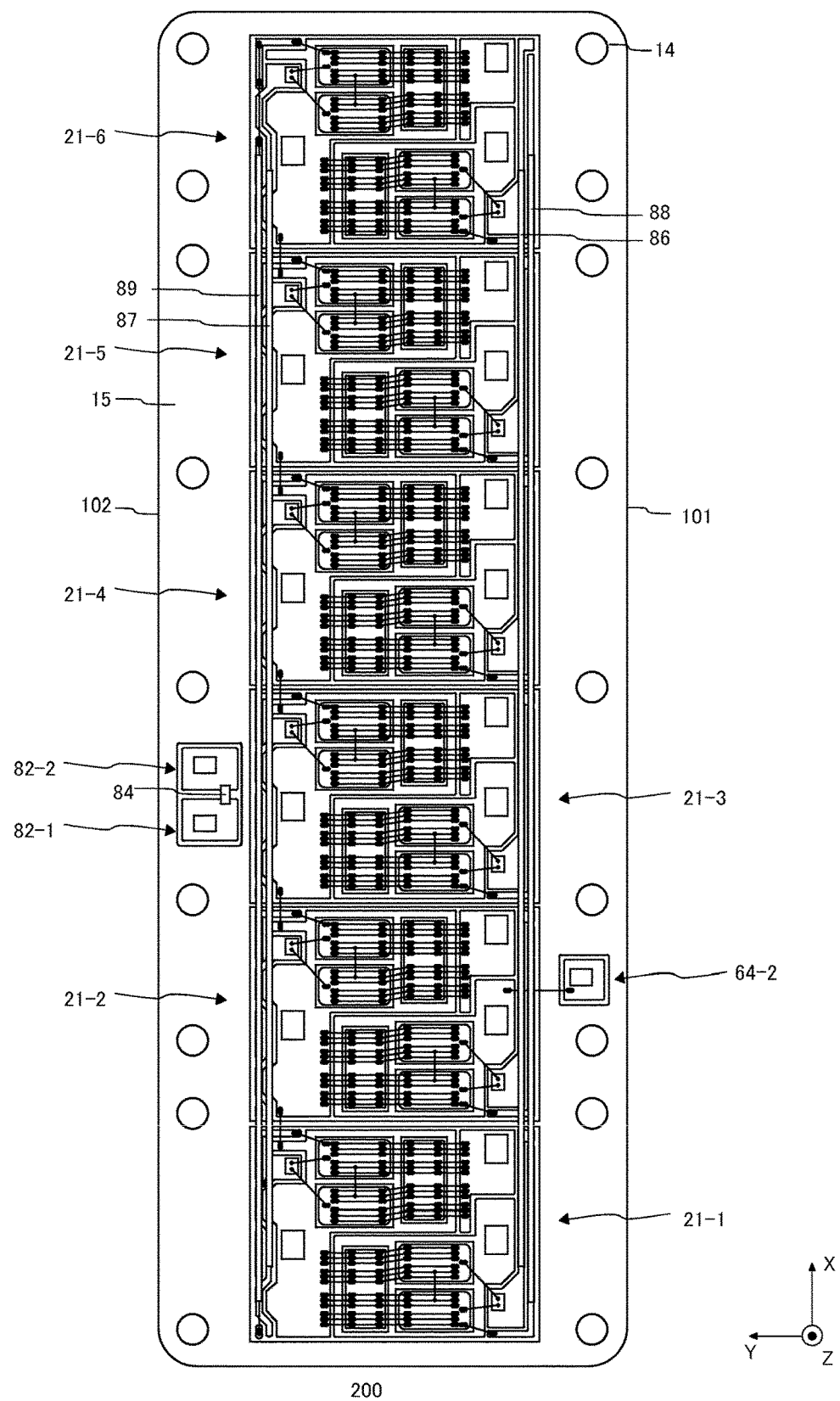
FIG. 9 illustrates one example of a semiconductor module 200 according to another embodiment of the present invention.

FIG. 9 illustrates one example of a semiconductor module 200 according to another embodiment of the present invention. The semiconductor module 200 is different from the semiconductor module 100 in that a second adjusting gate wiring 87 and a second adjusting sense wiring 89 are included instead of the gate connecting portion 52-1 and the sense-emitter connecting portion 64-1. Other than that, the semiconductor module 200 may have a same configuration as that of the semiconductor module 100.

The second adjusting gate wiring 87 adjusts a difference in wiring lengths between a plurality of second semiconductor chips 40 and a second gate terminal 51. In the present example, the second adjusting gate wiring 87 adjusts a difference in wiring lengths between a gate pad of each of the semiconductor chips 40-4 and 40-5 arranged on insulating substrates 21-1, 21-2, 21-3, 21-4, 21-5, and 21-6, and the second gate terminal 51. By virtue of having the second adjusting gate wiring 87, current to concentrate at a particular semiconductor chip 40 can be prevented, and thus a breakdown of the semiconductor chip 40 can be prevented. This can prevent an increase in switching loss as well.

The second adjusting gate wiring 87 may have a same configuration as that of the first adjusting gate wiring 86 illustrated in FIG. 4. That is, the second adjusting gate wiring 87 is arranged between at least one of the plurality of second main gate wirings and the second gate terminal 51. In the present example, the second adjusting gate wiring 87 is arranged between a circuit pattern 26 arranged on each insulating substrate 21 and the second gate terminal 51. That is, the second gate terminal 51 is connected to gate pads of the plurality of semiconductor chips 40 through the second adjusting gate wiring 87. Also, the second gate terminal 51 is connected to the gate pads of the plurality of semiconductor chips 40 through a plurality of second main gate wirings. In the present example, the second gate terminal 51 is connected to the gate pad of the semiconductor chip 40 provided to each insulating substrate 21 through the second main gate wiring provided to the each insulating substrate 21.

The second adjusting sense wiring 89 adjusts a difference in wiring lengths between the plurality of second semiconductor chips 40 and a second sense-emitter terminal 61. In the present example, the second adjusting sense wiring 89 adjusts a difference in wiring lengths between each semiconductor chip 40-4 arranged on the insulating substrates 21-1, 21-2, 21-3, 21-4, 21-5, and 21-6, and the second sense-emitter terminal 61. By virtue of having a second adjusting sense wiring 89, sense-current can be measured more precisely.

The second adjusting sense wiring 89 may have a same configuration as that of the first adjusting sense wiring 88 illustrated in FIG. 5. That is, the second adjusting sense wiring 89 is arranged between at least one of a plurality of second main sense wirings and the second sense-emitter terminal 61. In the present example, the second adjusting sense wiring 89 is arranged between the circuit pattern 26 arranged on each insulating substrate 21 and the second sense-emitter terminal 61. That is, the second sense-emitter terminal 61 is connected to main electrodes of the plurality of semiconductor chips 40 through the second adjusting sense wiring 89. Also, the second sense-emitter terminal 61 is connected to the main electrodes of the plurality of semiconductor chips 40 through the plurality of second main sense wirings. In the present example, the second sense-emitter terminal 61 is connected to a main electrode of the semiconductor chip 40 provided to each insulating substrate 21 through a second main sense wiring provided to the each insulating substrate 21.

In the present example, the first adjusting gate wiring 86 may be provided on a side of a first edge 101 of a base plate 15. Providing on the side of the first edge 101 of the base plate 15 means arranging at a place closer to the first edge 101 of the base plate 15 in the Y axis direction compared to a second edge 102 of the base plate 15. The second adjusting gate wiring 87 may be provided on a side of the second edge 102 of the base plate 15. Providing on the side of the second edge 102 of the base plate 15 means arranging at a place closer to the second edge 102 of the base plate 15 in the Y axis direction compared to the first edge 101 of the base plate 15. By virtue of individually providing the first adjusting gate wiring 86 and the second adjusting gate wiring 87 on the sides of the edges different from each other, the semiconductor chips 40 of the semiconductor module 200 can be arranged substantially point-symmetrically with respect to a reference being a center of the insulating substrate 21, and thereby the semiconductor module 200 can be miniaturized.

The first adjusting sense wiring 88 may be provided on the side of the first edge 101 of the base plate 15. The second adjusting sense wiring 89 may be provided on the side of the second edge 102 of the base plate 15. By virtue of individually providing the first adjusting sense wiring 88 and the second adjusting sense wiring 89 on the sides of the edges different from each other, the semiconductor chips 40 of the semiconductor module 200 can be arranged substantially point-symmetrically with respect to a reference being the center of the insulating substrate 21, and thereby the semiconductor module 200 can be miniaturized.

An extending direction of the second adjusting gate wiring 87 in a top view may be parallel to an extending direction of the second adjusting sense wiring 89 in the top view. In the present example, both of the extending directions of the second adjusting gate wiring 87 and the second adjusting sense wiring 89 are in the X axis direction. By virtue of making the extending directions of the second adjusting gate wiring 87 and the second adjusting sense wiring 89 parallel, the semiconductor module 200 can be miniaturized. The extending direction of the second adjusting gate wiring 87 in a top view may be parallel to an extending direction of the first adjusting gate wiring 86 in the top view. The extending direction of the second adjusting sense wiring 89 in a top view may be parallel to an extending direction of the first adjusting sense wiring 88 in the top view.

Figure 10:
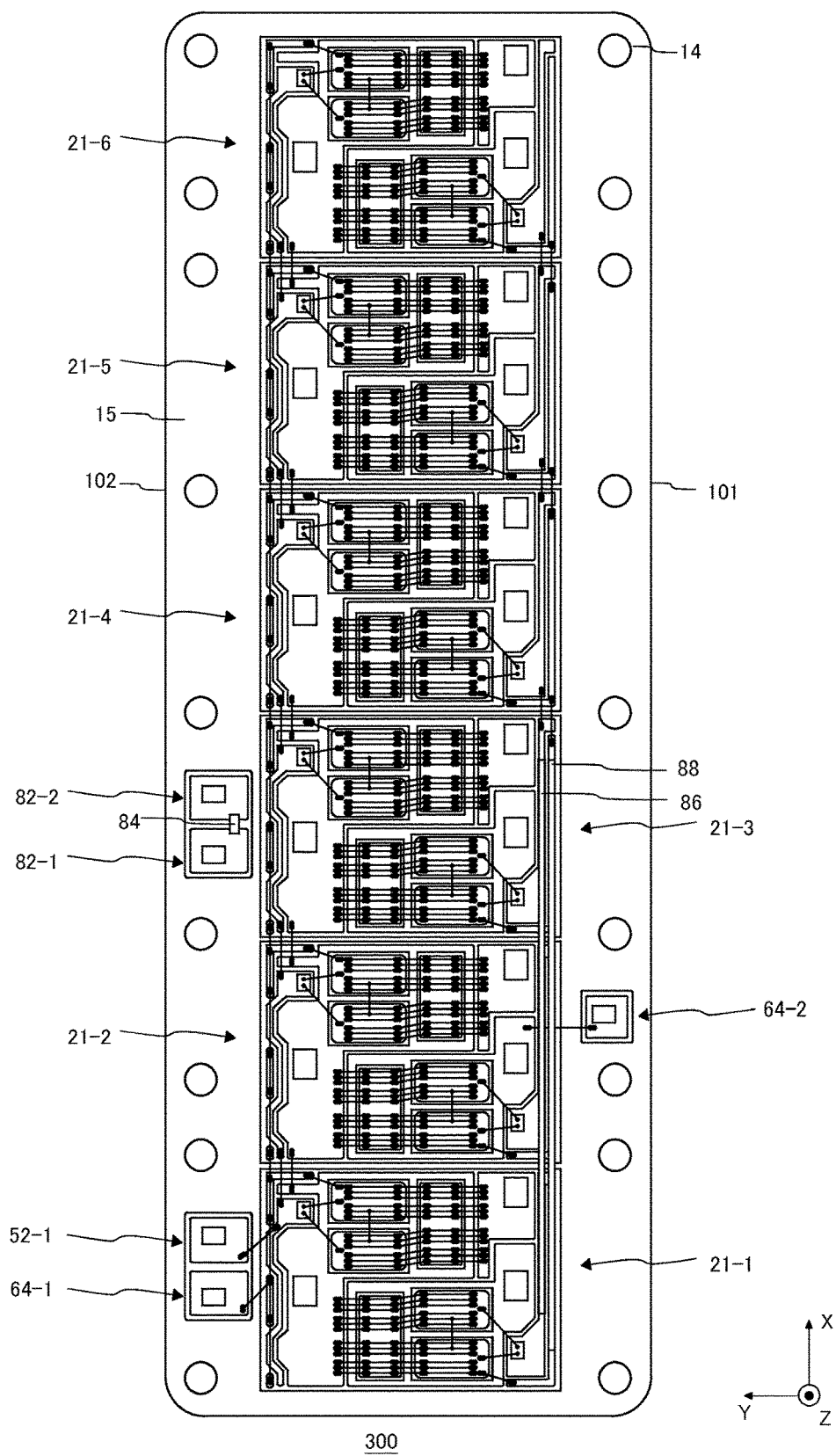
FIG. 10 illustrates one example of a semiconductor module 300 according to yet another embodiment of the present invention.

FIG. 10 illustrates one example of a semiconductor module 300 according to another embodiment of the present invention. Configurations of the first adjusting gate wiring 86 and the first adjusting sense wiring 88 of the semiconductor module 300 are different from those of the semiconductor module 100. Other than that, the semiconductor module 300 may have a same configuration as that of the semiconductor module 100.

Figure 11:
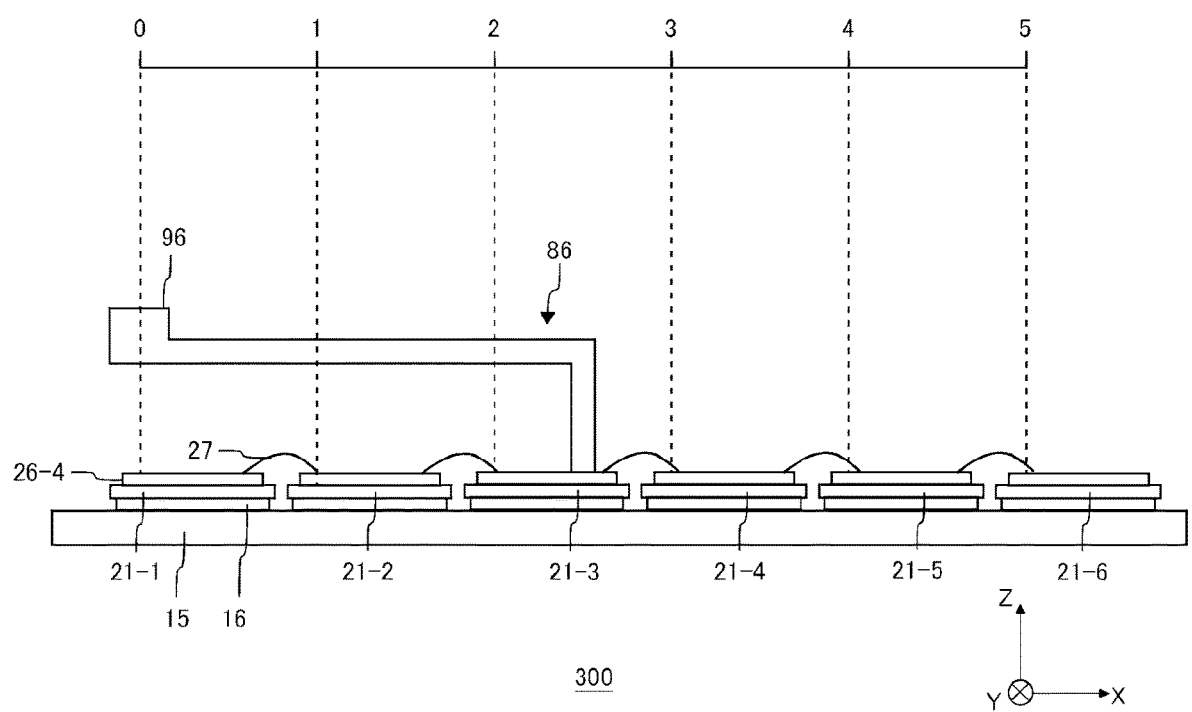
FIG. 11 illustrates one example of a first adjusting gate wiring 86 of the semiconductor module 300.

FIG. 11 illustrates one example of the first adjusting gate wiring 86 of the semiconductor module 300. FIG. 11 schematically illustrates the semiconductor module 300. FIG. 11 illustrates a distance to a gate pad connection point arranged on each insulating substrate 21 with respect to a reference being a gate pad connection point, which is a portion where a circuit pattern 26-4 arranged on the insulating substrate 21-1 is connected to a gate pad of a semiconductor chip 40.

In the present example, the first adjusting gate wiring 86 is connected to the circuit pattern 26-4 on an insulating substrate 21-3. Each circuit pattern 26-4 is connected to another circuit pattern 26-4 arranged on an adjacent insulating substrate 21 on a base plate 15 through a wire 27. In FIG. 11, the first adjusting gate wiring 86 is connected to the circuit pattern 26-4 on the insulating substrate 21-3 at an average position of every gate pad connection points. Therefore, by virtue of arranging the first adjusting gate wiring 86 on the insulating substrate 21-3, a difference in wiring lengths between gate pads of each of the semiconductor chips 40-1 and 40-2 arranged on the insulating substrates 21-1 and 21-6, and the first gate terminal 50 can be adjusted in the present example. Moreover, a difference in wiring lengths between the gate pads of each of the semiconductor chips 40-1 and 40-2 arranged on the insulating substrates 21-2 and 21-5, and the first gate terminal 50 can be adjusted. A difference in wiring lengths between gate pads of each of the semiconductor chips 40-1 and 40-2 arranged on the insulating substrates 21-3 and 21-4, and the first gate terminal 50 can be adjusted. In the semiconductor module 300, the difference in wiring lengths between the each semiconductor chip 40 and the first gate terminal 50 can be adjusted in a simpler configuration compared to the semiconductor module 100.

Figure 12:
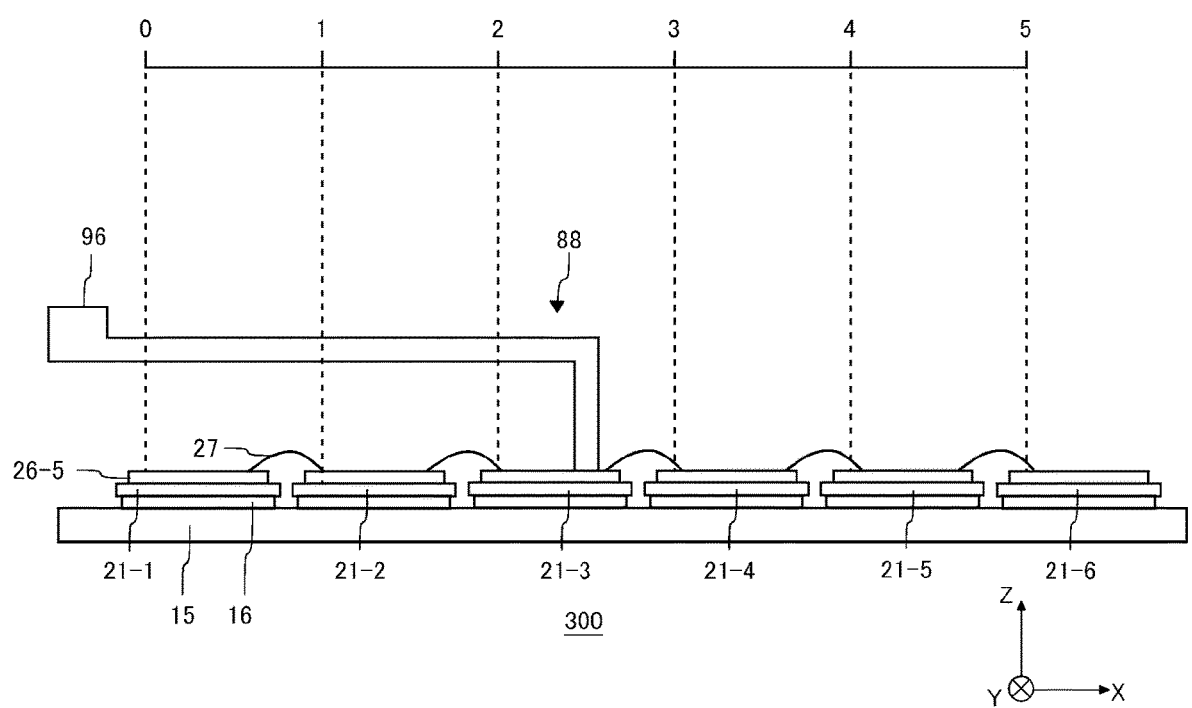
FIG. 12 illustrates one example of a first adjusting sense wiring 88 of the semiconductor module 300.

FIG. 12 illustrates one example of the first adjusting sense wiring 88 of the semiconductor module 300. FIG. 12 schematically illustrates the semiconductor module 300. FIG. 12 illustrates a distance to a main electrode connection point arranged on each insulating substrate 21 with respect to a reference being a main electrode connection point, which is a portion where a circuit pattern 26-5 arranged on the insulating substrate 21-1 is connected to a main electrode of the semiconductor chip 40.

In the present example, the first adjusting sense wiring 88 is connected to a circuit pattern 26-5 on the insulating substrate 21-3. Each circuit pattern 26-5 is connected to another circuit pattern 26-5 arranged on an adjacent insulating substrate 21 on a base plate 15 through a wire 27. In FIG. 12, the first adjusting sense wiring 88 is connected to the circuit pattern 26-5 on the insulating substrate 21-3 at an average position of every gate pad connection points. Therefore, by virtue of arranging the first adjusting sense wiring 88 on the insulating substrate 21-3, a difference in wiring lengths between the semiconductor chips 40-1 arranged on the insulating substrates 21-1 and 21-6, and the first sense-emitter terminal 60 can be adjusted in the present example. Moreover, a difference in wiring lengths between the semiconductor chips 40-1 arranged on the insulating substrates 21-2 and 21-5, and the first sense-emitter terminal 60 can be adjusted. A difference in wiring lengths between the semiconductor chips 40-1 arranged on the insulating substrates 21-3 and 21-4, and the first sense-emitter terminal 60 can be adjusted. In the semiconductor module 300, the difference in wiring lengths between the each semiconductor chip 40 and the first sense-emitter terminal 60 can be adjusted in a simpler configuration compared to the semiconductor module 100.

Figure 13:
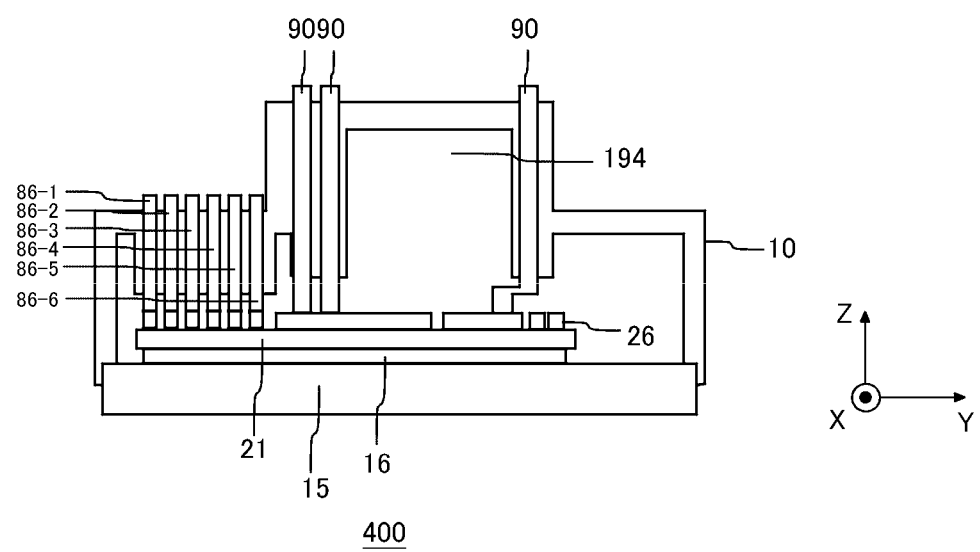
FIG. 13 schematically illustrates inside a semiconductor module 400 in a side view.
Figure 14:
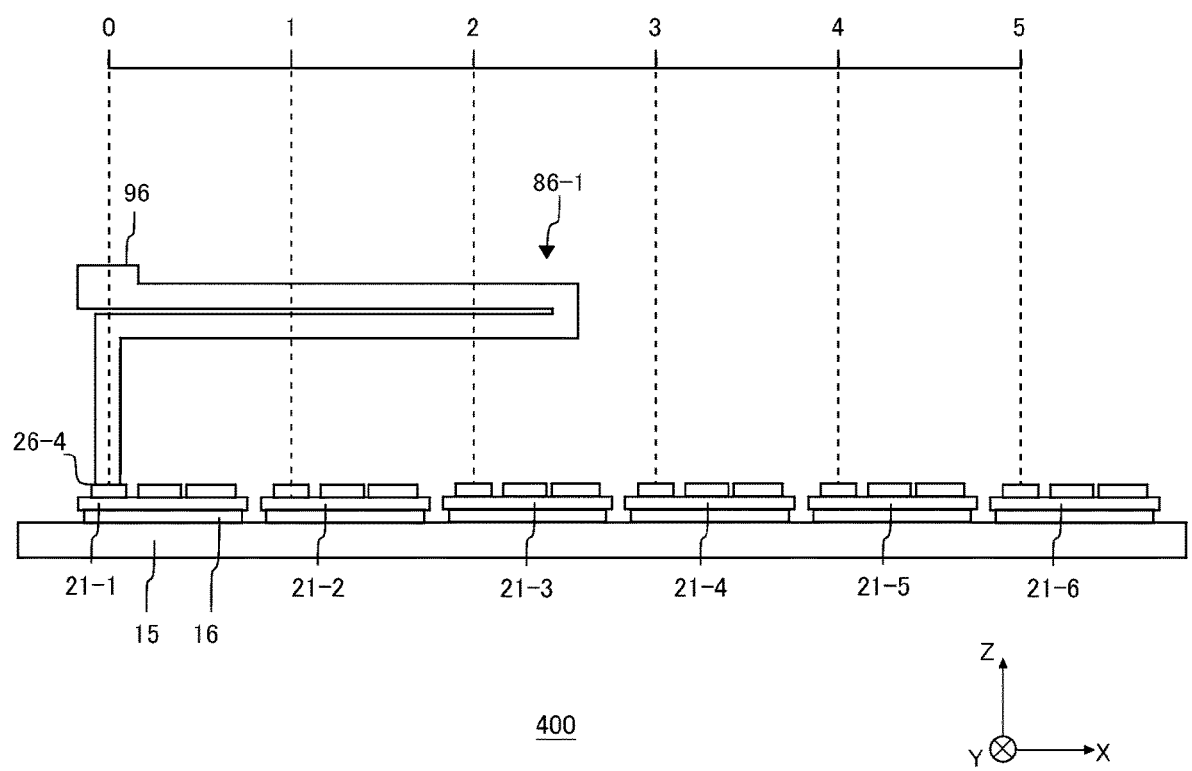
FIG. 14 illustrates one example of a first adjusting gate wiring 86-1 of the semiconductor module 400.
Figure 15:
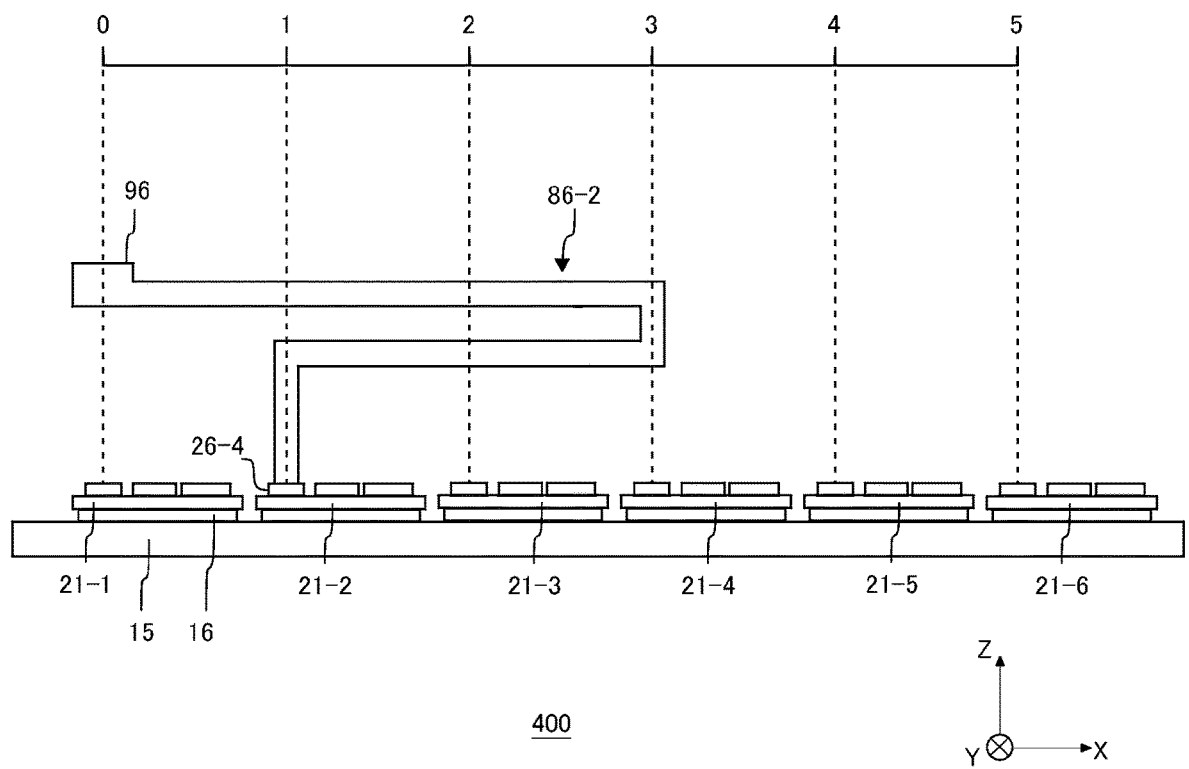
FIG. 15 illustrates one example of a first adjusting gate wiring 86-2 of the semiconductor module 400.
Figure 16:
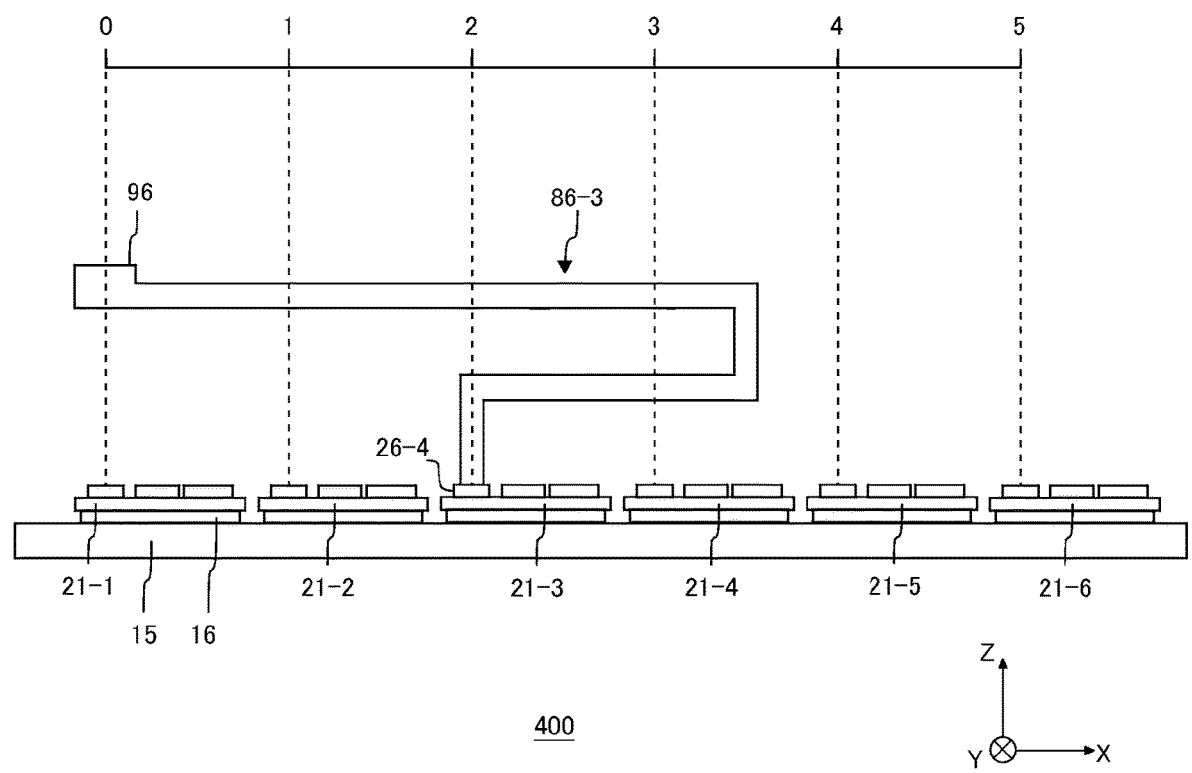
FIG. 16 illustrates one example of a first adjusting gate wiring 86-3 of the semiconductor module 400.
Figure 17:
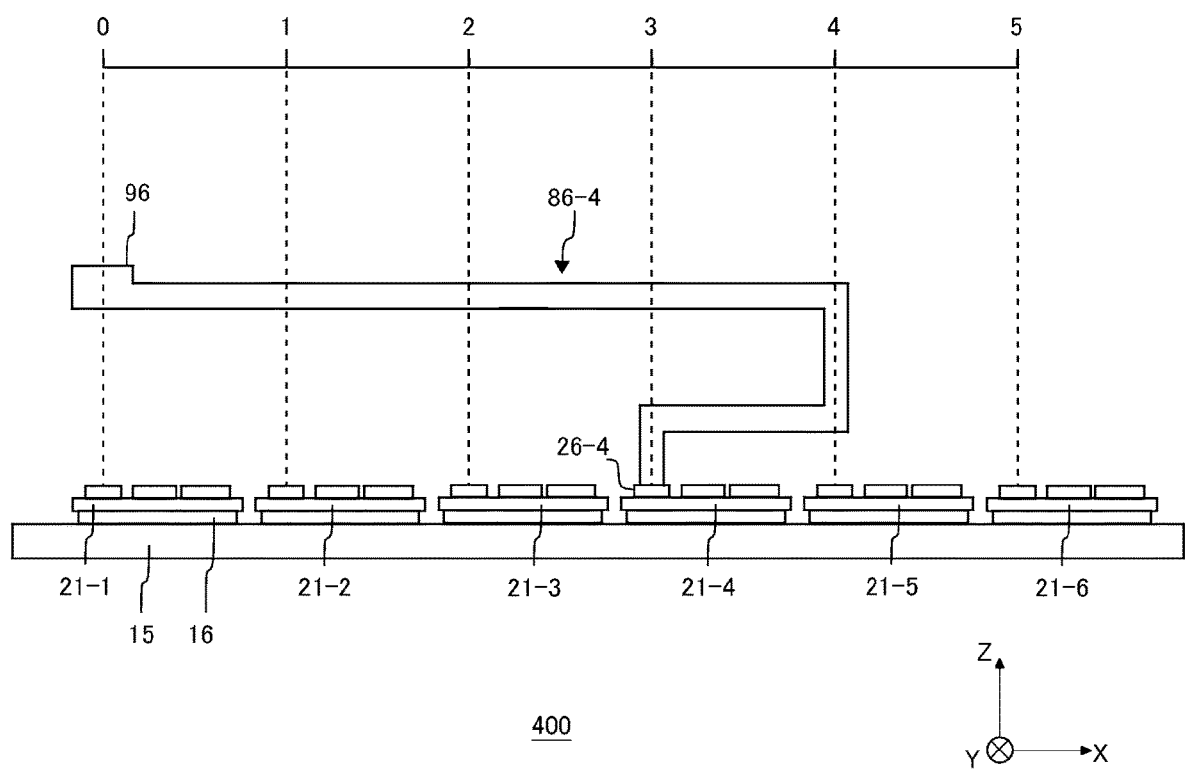
FIG. 17 illustrates one example of a first adjusting gate wiring 86-4 of the semiconductor module 400.
Figure 18:
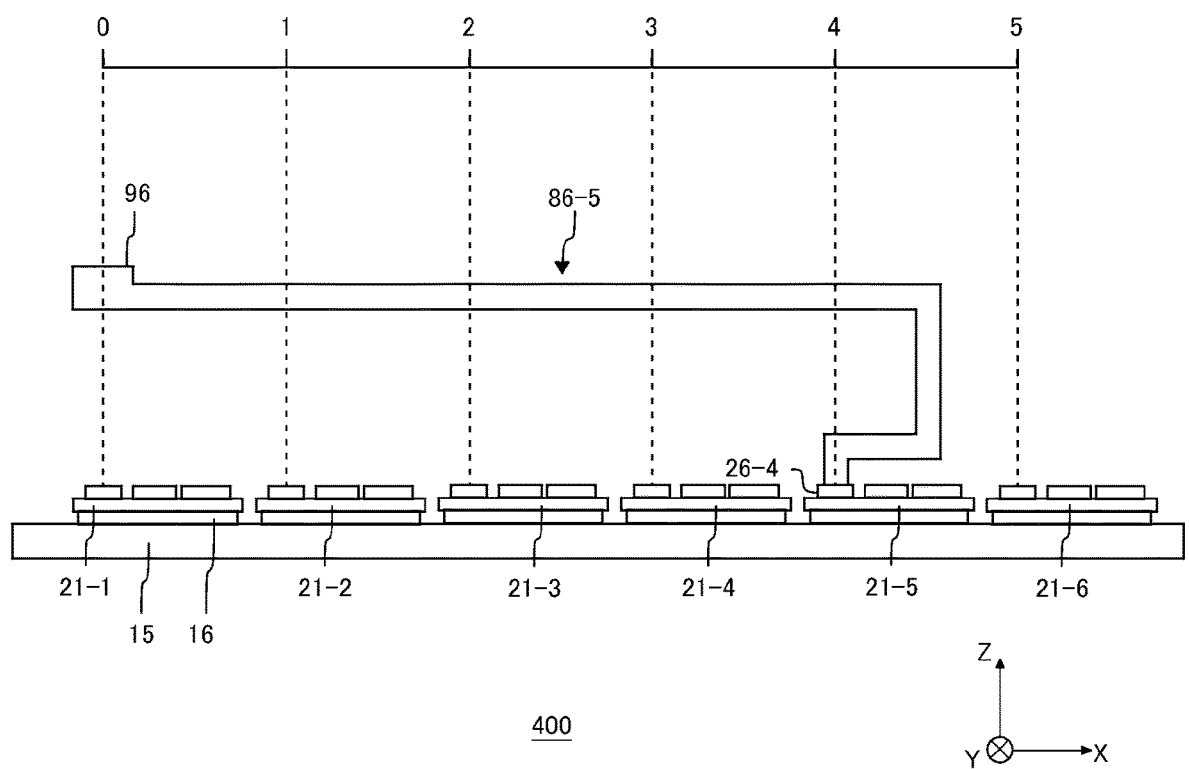
FIG. 18 illustrates one example of a first adjusting gate wiring 86-5 of the semiconductor module 400.
Figure 19:
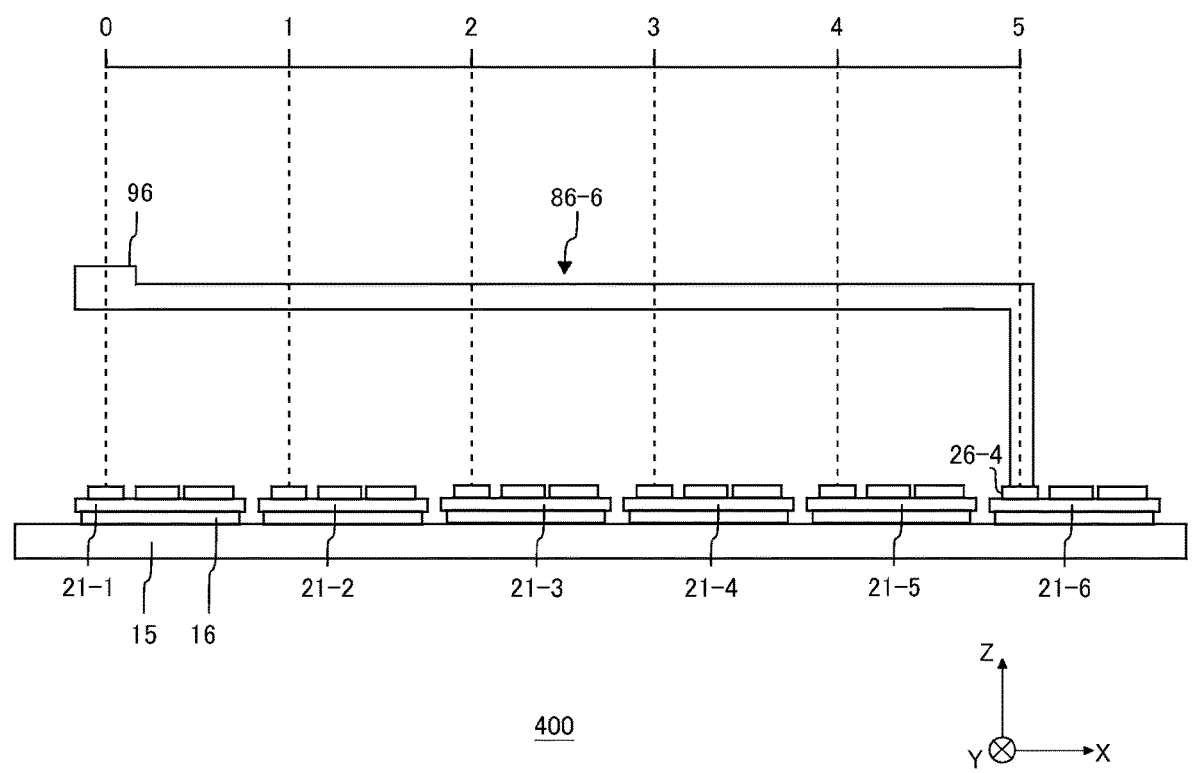
FIG. 19 illustrates one example of a first adjusting gate wiring 86-6 of the semiconductor module 400.

FIG. 13 schematically illustrates an inside of a semiconductor module 400 in a side view. The semiconductor module 400 is different from the semiconductor module 100 in that a plurality of first adjusting gate wirings 86 are included therein. Other than that, the semiconductor module 400 may have a same configuration as that of the semiconductor module 100. Note that, the first adjusting sense wiring 88 is omitted in the present example.

The semiconductor module 400 may include the plurality of first adjusting gate wirings 86. In the present example, the semiconductor module 400 includes a first adjusting gate wiring 86-1, a first adjusting gate wiring 86-2, a first adjusting gate wiring 86-3, a first adjusting gate wiring 86-4, a first adjusting gate wiring 86-5, and a first adjusting gate wiring 86-6. The plurality of first adjusting gate wirings 86 may be arranged along a Y axis direction. By virtue of including the plurality of first adjusting gate wirings 86, a current path can be simplified between a gate pad of each semiconductor chip 40 and a first gate terminal 50.

Note that, the semiconductor module 400 may include a plurality of first adjusting sense wirings 88. Similar to the first adjusting gate wirings 86, the plurality of first adjusting sense wirings 88 may be arranged along the Y axis direction. The plurality of first adjusting sense wirings 88 may be arranged not to be overlapped with the first adjusting gate wirings 86 in the Y axis direction, just as illustrated in FIG. 6. Alternatively, the plurality of first adjusting sense wirings 88 may be arranged overlapping with the first adjusting gate wirings 86 in the Y axis direction.

FIGS. 14, 15, 16, 17, 18, and 19 illustrate one example of the first adjusting gate wiring 86 of the semiconductor module 400. As illustrated in FIGS. 14, 15, 16, 17, 18, and 19, the semiconductor module 400 has equal wiring lengths for the first adjusting gate wirings 86-1, 86-2, 86-3, 86-4, 86-5, and 86-6. Each of the plurality of first adjusting gate wirings 86 may be connected to each of the plurality of semiconductor chips 40. In the present example, the plurality of first adjusting gate wirings 86 is connected to each semiconductor chip 40 arranged on each insulating substrate 21. The plurality of first adjusting sense wirings 88 may have a same configuration as a configuration of the first adjusting gate wiring 86 illustrated in FIGS. 14, 15, 16, 17, 18, and 19.

Figure 20:
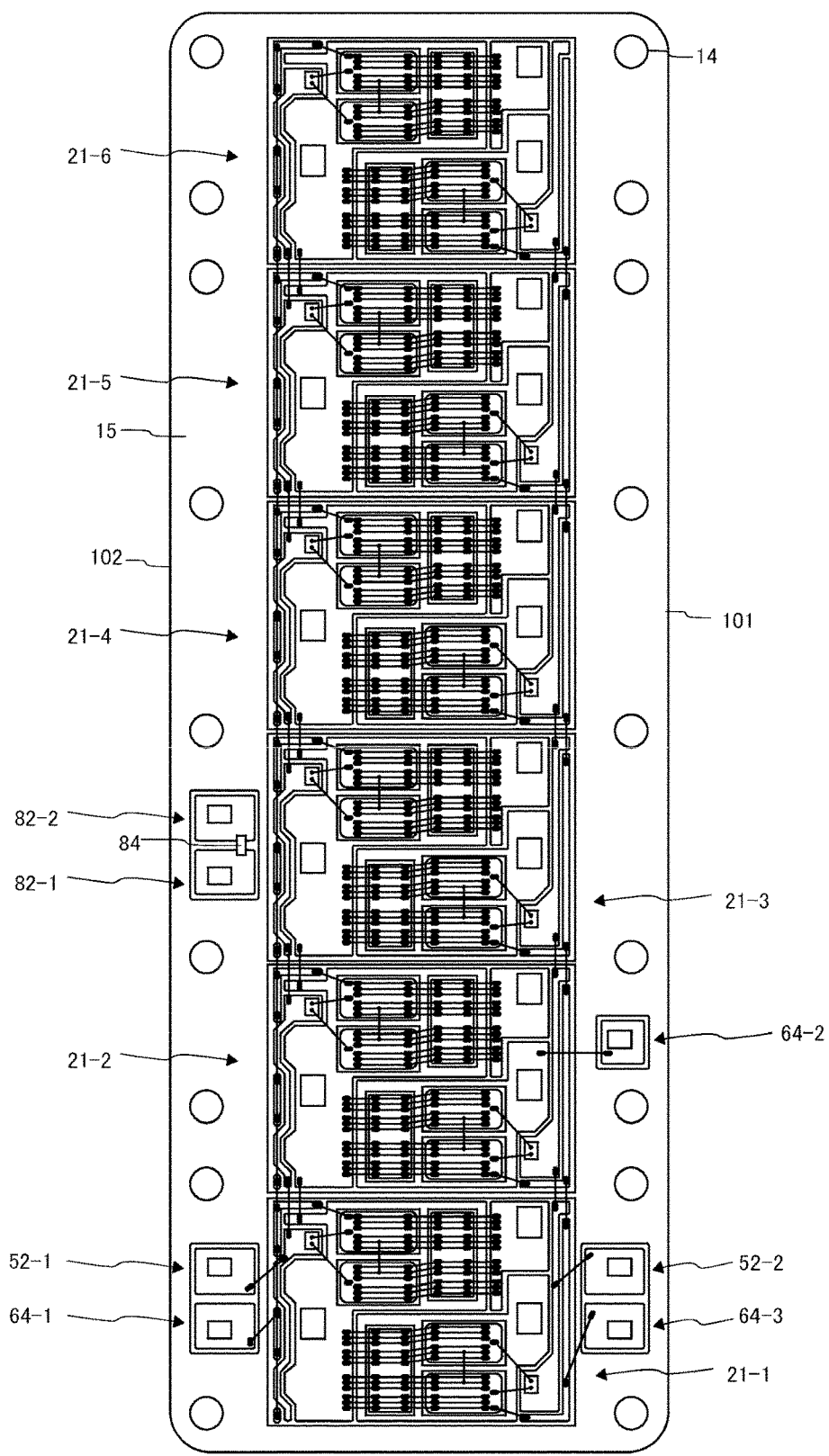
FIG. 20 illustrates one example of a semiconductor module 500 according to a comparative example.

FIG. 20 illustrates one example of a semiconductor module 500 according to a comparative example. The semiconductor module 500 is different from the semiconductor module 100 in that a gate connecting portion 52-2 and a sense-emitter connecting portion 64-3 are included instead of the first adjusting gate wiring 86 and the first adjusting sense wiring 88. Other than that, the semiconductor module 500 may have a same configuration as that of the semiconductor module 100. In the present example, wiring lengths are different between a first gate terminal 50 and a semiconductor chip 40 arranged on each insulating substrate 21.

Figure 21:
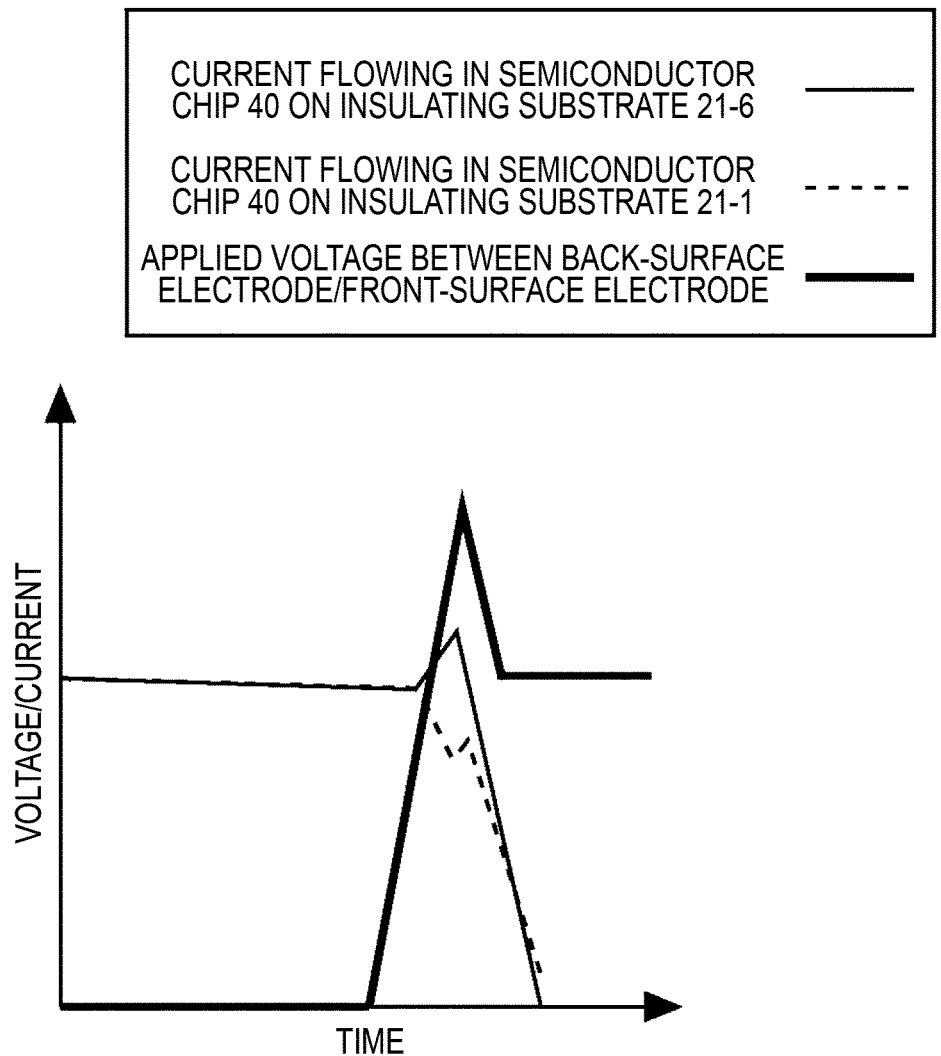
FIG. 21 illustrates a relationship between a semiconductor chip 40 and applied voltage in the semiconductor module 500.
Figure 22:
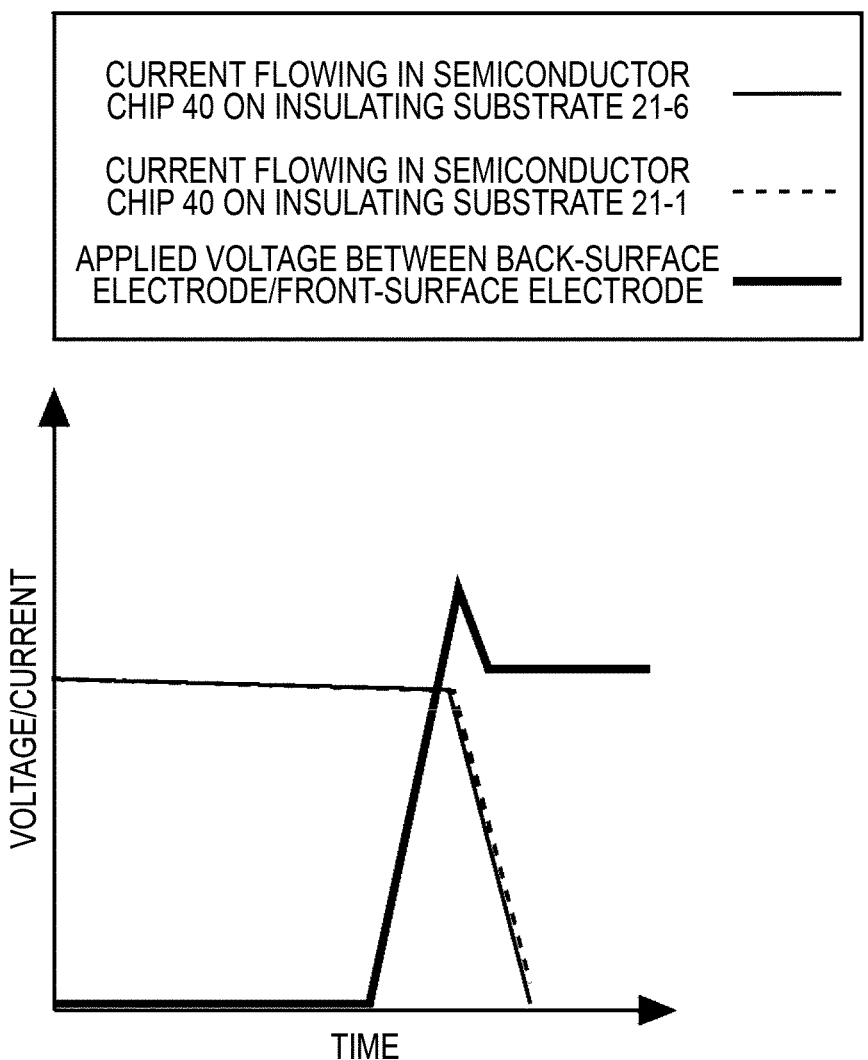
FIG. 22 illustrates a relationship between a semiconductor chip 40 and applied voltage in the semiconductor module 100.

FIG. 21 illustrates a relationship between the semiconductor chip 40 and applied voltage in the semiconductor module 500. FIG. 22 illustrates a relationship between the semiconductor chip 40 and applied voltage in the semiconductor module 100. The applied voltage in FIGS. 21 and 22 is a collector-emitter voltage applied to the semiconductor chip 40 being an IGBT. That is, the applied voltage in FIGS. 21 and 22 is a voltage between a back-surface electrode and a main electrode of the semiconductor chip 40.

In FIG. 21, as the semiconductor chip 40 being the IGBT turns on, applied voltage jumps up. At this time, a jumping amount of current flowing in a semiconductor chip on an insulating substrate 21-1 is less compared to a jumping amount of current flowing in a semiconductor chip on an insulating substrate 21-6. On the other hand, in FIG. 22, a jumping amount of current flowing in the semiconductor chip on the insulating substrate 21-1 is approximately equal to a jumping amount of current flowing in the semiconductor chip on the insulating substrate 21-6. This is because the first adjusting gate wiring 86 and the first adjusting sense wiring 88 equalize the lengths of wirings connected to each semiconductor chip 40 on each insulating substrate 21, so that inductances are equalized, and the each semiconductor chip 40 on the each insulating substrate 21 has approximately a same transient change in a gate-emitter voltage from each other. Therefore, in the case of FIG. 22, transiently conducted currents can be equalized between current flowing in the semiconductor chip 40 on the insulating substrate 21-6 and current flowing in the semiconductor chip 40 on the insulating substrate 21-1, compared to the case in FIG. 21.

Hence, a breakdown and an increase in switching loss of the semiconductor chip 40 can be prevented.

While the present invention has been described with the embodiments, the technical scope of the present invention is not limited to the above described embodiments. It is apparent to persons skilled in the art that various alterations and improvements can be added to the above-described embodiments. It is also apparent from the description of the claims that embodiments added with such alterations or improvements can be included in the technical scope of the present invention.

What is claimed is:

1. A semiconductor module comprising:
    a plurality of first semiconductor chips;
    a resin case provided surrounding an accommodation space for accommodating the plurality of first semiconductor chips;
    a first gate terminal connected to a gate pad of the plurality of first semiconductor chips;
    a plurality of first main gate wirings provided in the accommodation space, each of which is connected to the gate pad of the plurality of first semiconductor chips;
    a first adjusting gate wiring arranged between at least one of the plurality of first main gate wirings and the first gate terminal, and configured to adjust a difference in wiring lengths between the plurality of first semiconductor chips and the first gate terminal;
    a first sense-emitter terminal connected to a main electrode of the plurality of first semiconductor chips;
    a plurality of first main sense wirings provided in the accommodation space, each of which is connected to the main electrode of the plurality of first semiconductor chips; and
    a first adjusting sense wiring arranged between at least one of the plurality of first main sense wirings and the first sense-emitter terminal, and configured to adjust a difference in wiring lengths between the plurality of first semiconductor chips and the first sense-emitter terminal.

2. The semiconductor module according to claim 1, wherein at least a part of the first adjusting gate wiring is embedded in the resin case.

3. The semiconductor module according to claim 2, further comprising:
    at least one insulating substrate, each for arranging at least one of the plurality of first semiconductor chips thereon, wherein
    the plurality of first main gate wirings is a wiring pattern provided on the insulating substrate.

4. The semiconductor module according to claim 1, further comprising:
    at least one insulating substrate, each for arranging at least one of the plurality of first semiconductor chips thereon, wherein
    the plurality of first main gate wirings is a wiring pattern provided on the insulating substrate.

5. The semiconductor module according to claim 4, wherein the first adjusting gate wiring is in a tabular shape, and has a main surface on a surface perpendicular to a main surface of the insulating substrate and parallel to an arrangement direction of a plurality of insulating substrates, each being identical to the insulating substrate.

6. The semiconductor module according to claim 1, wherein at least a part of the first adjusting sense wiring is embedded in the resin case.

7. The semiconductor module according to claim 6, further comprising:
   at least one insulating substrate, each for arranging at least one of the plurality of first semiconductor chips thereon, wherein
      the plurality of first main sense wirings is a wiring pattern provided on the insulating substrate.

8. The semiconductor module according to claim 1, further comprising:
   at least one insulating substrate, each for arranging at least one of the plurality of first semiconductor chips thereon, wherein
      the plurality of first main sense wirings is a wiring pattern provided on the insulating substrate.

9. The semiconductor module according to claim 1, further comprising:
   a plurality of second semiconductor chips;
   a second gate terminal connected to a gate pad of the plurality of second semiconductor chips;
   a plurality of second main gate wirings provided in the accommodation space, each of which is connected to the gate pad of the plurality of second semiconductor chips; and
   a second adjusting gate wiring arranged between at least one of the plurality of second main gate wirings and the second gate terminal, and configured to adjust a difference in wiring lengths between the plurality of second semiconductor chips and the second gate terminal.

10. The semiconductor module according to claim 9, further comprising:
   a second sense-emitter terminal connected to a main electrode of the plurality of second semiconductor chips;
   a plurality of second main sense wirings provided in the accommodation space, each of which is connected to the main electrode of the plurality of second semiconductor chips; and
   a second adjusting sense wiring arranged between at least one of the plurality of second main sense wirings and the second sense-emitter terminal, and configured to adjust a difference in wiring lengths between the plurality of second semiconductor chips and the second sense-emitter terminal.

11. The semiconductor module according to claim 1, comprising:
   a plurality of first adjusting gate wirings, each being identical to the first adjusting gate wiring, wherein
      each of the plurality of first adjusting gate wirings is connected to each of the plurality of first semiconductor chips.

12. The semiconductor module according to claim 1, wherein an extending direction of the first adjusting gate wiring in a top view is parallel to an extending direction of the first adjusting sense wiring in a top view.

13. A semiconductor module comprising:
   a plurality of first semiconductor chips;
   a resin case provided surrounding an accommodation space for accommodating the plurality of first semiconductor chips;
   a first gate terminal connected to a gate pad of the plurality of first semiconductor chips;
   a plurality of first main gate wirings provided in the accommodation space, each of which is connected to the gate pad of the plurality of first semiconductor chips;
   a first adjusting gate wiring arranged between at least one of the plurality of first main gate wirings and the first gate terminal, and configured to adjust a difference in wiring lengths between the plurality of first semiconductor chips and the first gate terminal;
   a plurality of second semiconductor chips;
   a second gate terminal connected to a gate pad of the plurality of second semiconductor chips;
   a plurality of second main gate wirings provided in the accommodation space, each of which is connected to the gate pad of the plurality of second semiconductor chips;
   a second adjusting gate wiring arranged between at least one of the plurality of second main gate wirings and the second gate terminal, and configured to adjust a difference in wiring lengths between the plurality of second semiconductor chips and the second gate terminal; and
   a base plate having a first edge, and a second edge opposite to the first edge, wherein
      the first adjusting gate wiring is provided on a side of the first edge of the base plate, and
      the second adjusting gate wiring is provided on a side of the second edge of the base plate.

14. A semiconductor module according to claim 1, comprising:
   a plurality of first semiconductor chips;
   a resin case provided surrounding an accommodation space for accommodating the plurality of first semiconductor chips;
   a first gate terminal connected to a gate pad of the plurality of first semiconductor chips;
   a plurality of first main gate wirings provided in the accommodation space, each of which is connected to the gate pad of the plurality of first semiconductor chips; and
   a first adjusting gate wiring arranged between at least one of the plurality of first main gate wirings and the first gate terminal, and configured to adjust a difference in wiring lengths between the plurality of first semiconductor chips and the first gate terminal, wherein
   the first adjusting gate wiring has
      a plurality of individual gate adjusting wirings, each provided on each of the plurality of first semiconductor chips, and
      a common gate adjusting wiring connected to the plurality of individual gate adjusting wirings.

15. The semiconductor module according to claim 14, wherein the common gate adjusting wiring is arranged above the plurality of individual gate adjusting wirings in a height direction perpendicular to an upper surface of the plurality of first semiconductor chips.

16. The semiconductor module according to claim 14, wherein when a distance between one first semiconductor chip among the plurality of first semiconductor chips and the first gate terminal becomes closer, an individual gate adjusting wiring among the plurality of individual gate adjusting wirings connected to the one first semiconductor chip becomes longer.

17. A semiconductor module comprising:
   a plurality of first semiconductor chips;
   a resin case provided surrounding an accommodation space for accommodating the plurality of first semiconductor chips;

a first gate terminal electrically connected to a plurality of gate pads, each of which is provided for a corresponding one first semiconductor chip among the plurality of first semiconductor chips;

a plurality of first main gate wirings provided in the accommodation space, each of which is connected to each gate pad of the plurality of first semiconductor chips; and a first adjusting gate wiring arranged between at least one of the plurality of first main gate wirings and the first gate terminal, and configured to adjust a difference in wiring lengths between the plurality of first semiconductor chips and the first gate terminal.

18. The semiconductor module according to claim 17, further comprising:

at least one insulating substrate, each for arranging at least one of the plurality of first semiconductor chips thereon, wherein the plurality of first main gate wirings is a wiring pattern provided on the insulating substrate, and the first adjusting gate wiring is in a tabular shape, and has a main surface on a surface perpendicular to a main surface of the insulating substrate and parallel to an arrangement direction of a plurality of insulating substrates, each being identical to the insulating substrate.

19. The semiconductor module according to claim 17, further comprising:

a first sense-emitter terminal connected to a main electrode of the plurality of first semiconductor chips;

a plurality of first main sense wirings provided in the accommodation space, each of which is connected to the main electrode of the plurality of first semiconductor chips; and a first adjusting sense wiring arranged between at least one of the plurality of first main sense wirings and the first sense-emitter terminal, and configured to adjust a difference in wiring lengths between the plurality of first semiconductor chips and the first sense-emitter terminal.

20. The semiconductor module according to claim 17, further comprising:

a plurality of second semiconductor chips;

a second gate terminal connected to a gate pad of the plurality of second semiconductor chips;

a plurality of second main gate wirings provided in the accommodation space, each of which is connected to the gate pad of the plurality of second semiconductor chips;

a second adjusting gate wiring arranged between at least one of the plurality of second main gate wirings and the second gate terminal, and configured to adjust a difference in wiring lengths between the plurality of second semiconductor chips and the second gate terminal; and a base plate having a first edge, and a second edge opposite to the first edge, wherein the first adjusting gate wiring is provided on a side of the first edge of the base plate, and the second adjusting gate wiring is provided on a side of the second edge of the base plate.

21. The semiconductor module according to claim 17, wherein the first adjusting gate wiring has a plurality of individual gate adjusting wirings, each provided on each of the plurality of first semiconductor chips, and a common gate adjusting wiring connected to the plurality of individual gate adjusting wirings.

22. A semiconductor module comprising:

a plurality of first semiconductor chips;

a resin case provided distant away from and above the plurality of first semiconductor chips and surrounding an accommodation space for accommodating the plurality of first semiconductor chips;

a first gate terminal connected to a gate pad of the plurality of first semiconductor chips;

a plurality of first main gate wirings provided in the accommodation space, each of which is connected to the gate pad of the plurality of first semiconductor chips; and a first adjusting gate wiring arranged between at least one of the plurality of first main gate wirings and the first gate terminal, and configured to adjust a difference in wiring lengths between the plurality of first semiconductor chips and the first gate terminal, wherein at least a part of the first adjusting gate wiring is embedded in the resin case.

23. The semiconductor module according to claim 22, further comprising:

at least one insulating substrate, each for arranging at least one of the plurality of first semiconductor chips thereon, wherein the plurality of first main gate wirings is a wiring pattern provided on the insulating substrate, and the first adjusting gate wiring is in a tabular shape, and has a main surface on a surface perpendicular to a main surface of the insulating substrate and parallel to an arrangement direction of a plurality of insulating substrates, each being identical to the insulating substrate.

24. The semiconductor module according to claim 22, further comprising:

a first sense-emitter terminal connected to a main electrode of the plurality of first semiconductor chips;

a plurality of first main sense wirings provided in the accommodation space, each of which is connected to the main electrode of the plurality of first semiconductor chips; and a first adjusting sense wiring arranged between at least one of the plurality of first main sense wirings and the first sense-emitter terminal, and configured to adjust a difference in wiring lengths between the plurality of first semiconductor chips and the first sense-emitter terminal.

25. The semiconductor module according to claim 22, further comprising:

a plurality of second semiconductor chips;

a second gate terminal connected to a gate pad of the plurality of second semiconductor chips;

a plurality of second main gate wirings provided in the accommodation space, each of which is connected to the gate pad of the plurality of second semiconductor chips;

a second adjusting gate wiring arranged between at least one of the plurality of second main gate wirings and the second gate terminal, and configured to adjust a difference in wiring lengths between the plurality of second semiconductor chips and the second gate terminal; and a base plate having a first edge, and a second edge opposite to the first edge, wherein the first adjusting gate wiring is provided on a side of the first edge of the base plate, and the second adjusting gate wiring is provided on a side of the second edge of the base plate.

26. The semiconductor module according to claim 22, wherein the first adjusting gate wiring has
- a plurality of individual gate adjusting wirings, each provided on each of the plurality of first semiconductor chips, and
- a common gate adjusting wiring connected to the plurality of individual gate adjusting wirings.

\* \* \* \* \*